(12) United States Patent
Lim et al.

(10) Patent No.: US 8,178,368 B2
(45) Date of Patent: May 15, 2012

(54) TEST CHIPLETS FOR DEVICES

(75) Inventors: Victor Seng Keong Lim, Singapore (SG); Rachel Yie Fang Wai, Singapore (SG); Fang Hong Gn, Singapore (SG); Liang Choo Hsia, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 302 days.

(21) Appl. No.: 12/621,513

(22) Filed: Nov. 19, 2009

(65) Prior Publication Data
US 2011/0114949 A1    May 19, 2011

(51) Int. Cl.
*G06F 17/50* (2006.01)
(52) U.S. Cl. .................. 438/18; 257/E21.531; 716/52

(58) Field of Classification Search .............. 257/48, 257/E21.529, E21.531; 438/11, 17, 18; 716/52; 706/52
See application file for complete search history.

(56) References Cited

U.S. PATENT DOCUMENTS

| | | | |
|---|---|---|---|
| 6,606,273 B1* | 8/2003 | Guo et al. ............... 365/201 |
| 2006/0005154 A1* | 1/2006 | Cobb et al. .............. 716/5 |
| 2008/0169466 A1* | 7/2008 | Stine et al. ............... 257/48 |
| 2009/0057664 A1* | 3/2009 | Lim et al. ............... 257/48 |

* cited by examiner

*Primary Examiner* — Thomas L Dickey
(74) *Attorney, Agent, or Firm* — Horizon IP Pte Ltd

(57) ABSTRACT

A method of forming a device is disclosed. The method includes providing a substrate on which the device is formed. It also includes forming a test cell on the substrate. The test cell includes a defect programmed into the cell to facilitate defect detection.

20 Claims, 27 Drawing Sheets

800

TEST CHIPLETS FOR DEVICES

CROSS-REFERENCE

This application is concurrently filed with application Ser. No. 12/621,510 entitled "Defect Detection Recipe Definition", which is herein incorporated by reference for all purposes.

BACKGROUND

In the fabrication process of electronic devices, for instance, integrated circuits (ICs), it is essential to detect defects effectively at an early stage in order to maintain and improve yield rates. As IC feature sizes shrink, subtle defects may become "killer defects" which can result in improper electrical device functions. Hence, high sensitivity recipes need to be developed to capture low-signal but yield limiting defects.

One of the issues for optimizing a defect detection recipe is the existence of a large amount of nuisance defects which affects the efficiency of distinguishing the "killer defects". For example, as the design rule gets more stringent, the main contributors of noise are not only the noise from the patterns, but also those from nuisance defects like hillocks, silicon cones and discolorations which can be significantly larger than the subtle killer defects. In order to suppress nuisance defects and locate killer defects, tremendous efforts and time need to be invested which can affect productivity.

Therefore, challenges for developing a cost-effective defect detection technique exist.

SUMMARY OF THE INVENTION

A method of forming a device is disclosed. The method includes providing a substrate on which the device is formed. It also includes forming a test cell on the substrate. The test cell includes a defect programmed into the cell to facilitate defect detection.

In another embodiment, a method of forming a test chiplet is presented. The method includes providing a test artwork file containing the test chiplet. It also includes modifying the artwork file to program defects into the test chiplet. A mask set derived from the artwork file is formed. The mask set is used to form the chiplet on a substrate.

In yet another embodiment, a device is disclosed. The device includes a substrate and device components formed on the substrate. It also includes a test cell formed on the substrate. The test cell includes a defect programmed into the cell to facilitate defect detection.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, for example, semiconductor devices or integrated circuits. More particularly, the devices facilitate defect detection in devices. The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

Figure 1A:
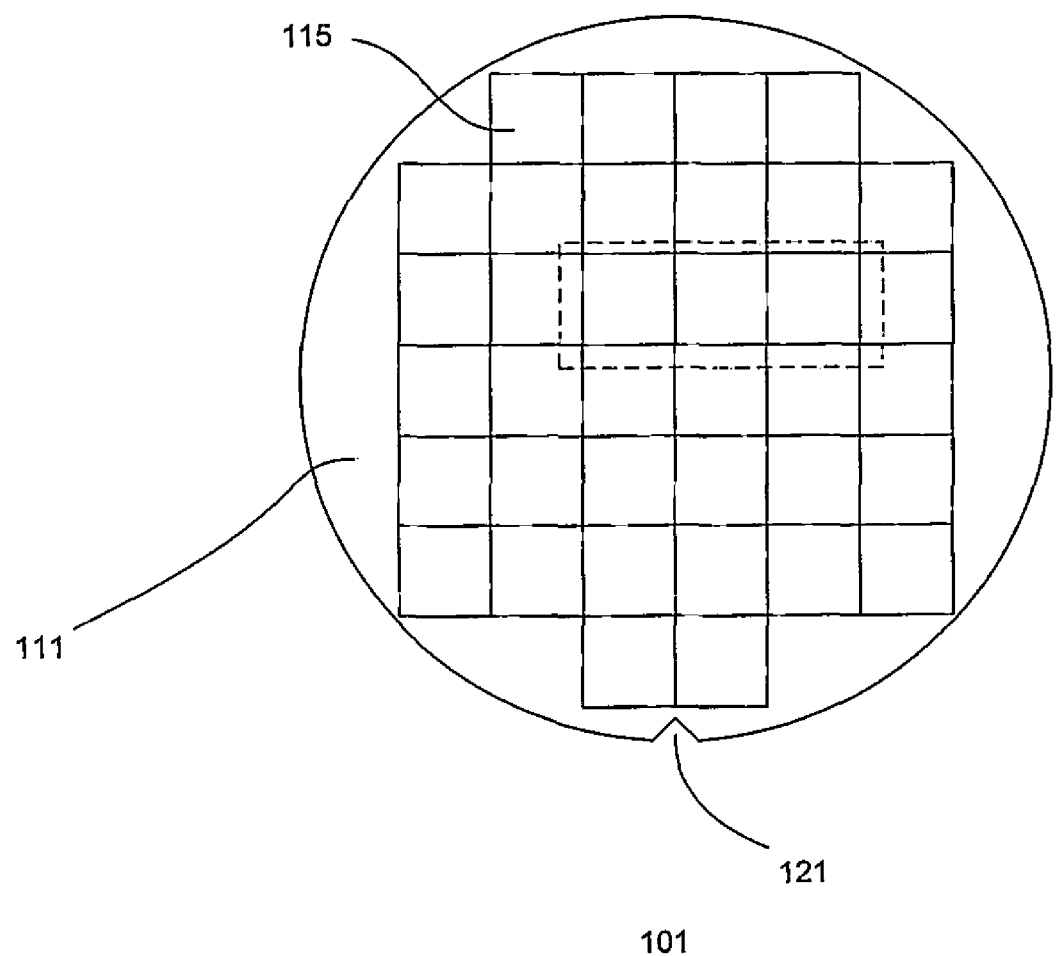
FIG. 1a shows a semiconductor wafer.

FIG. 1a shows a semiconductor wafer 101. The semiconductor wafer, for example, comprises a silicon wafer. Other types of wafers are also useful. For example, the wafer may be a p-type, n-type, silicon-on-insulator or silicon germanium wafer. Depending on the type of device, the wafer may comprise a non-semiconductor material. The wafer may include a notch 121 to indicate the crystal orientation of the wafer. Other techniques for indicating the crystal orientation may also be useful. Additional indicators may also be included to indicate the dopant type of the wafer.

The wafer includes an active surface 111 on which devices 115 are formed. A plurality of devices may be formed on the wafer in parallel. The devices, for example, are arranged in rows along a first (x) direction and columns along a second (y) direction. The devices are subsequently singulated into individual dies, assembled and tested. In other embodiments, the wafer may include a single device.

The fabrication of devices, such as integrated circuits (ICs), involves the formation of features on a substrate that make up circuit components, such as transistors, resistors and capacitors. The devices are interconnected, enabling the device to perform the desired functions. Interconnections are formed by forming contacts and conductive lines in a dielectric layer using, for example, damascene techniques. The features and interconnections are formed by repeatedly depositing and patterning layers on the wafer. The devices may have multiple interconnection layers. The structures of the different layers of the device are created or patterned using respective mask and etch techniques.

Figure 1B:
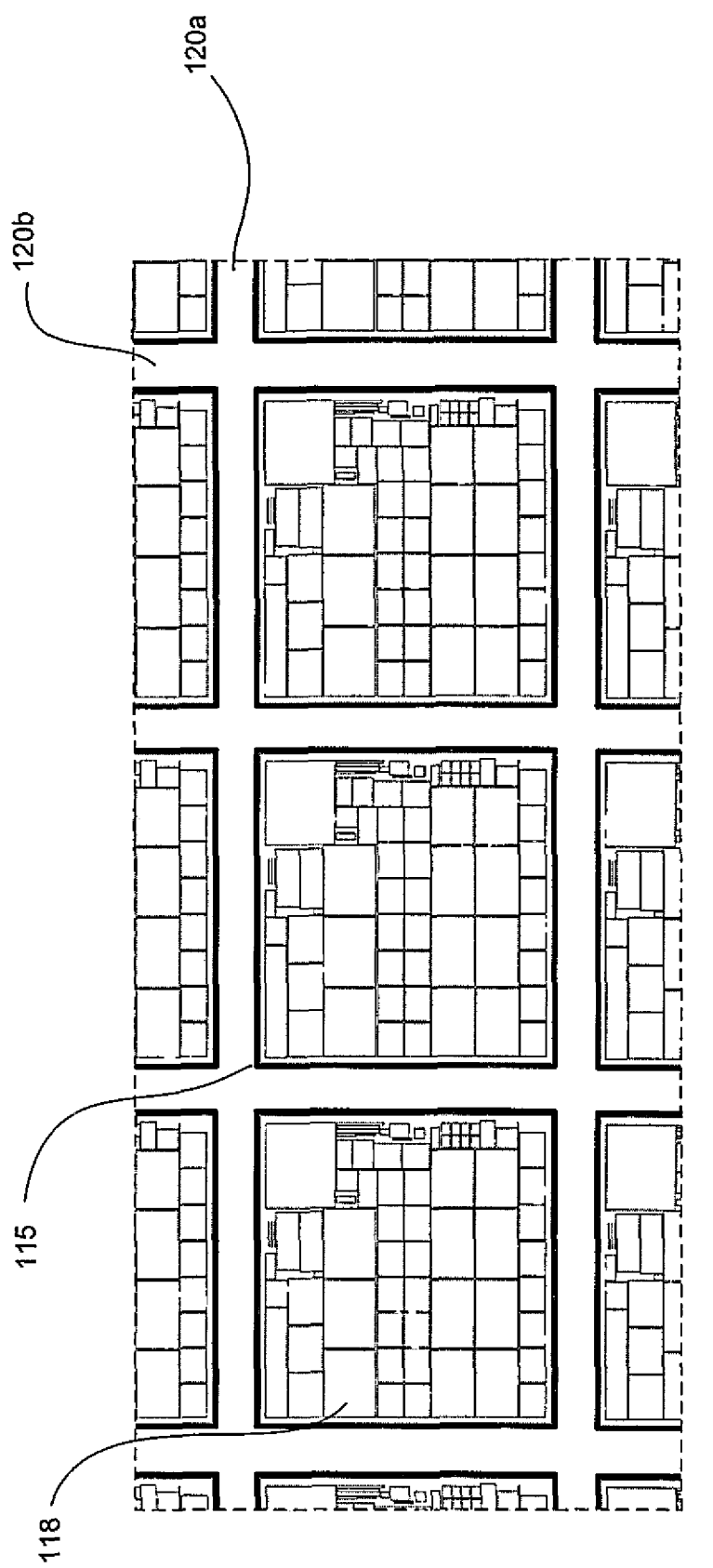
FIG. 1b shows a portion of a wafer.

FIG. 1b shows a portion 105 of the wafer of FIG. 1a in greater detail. As shown, the portion comprises three adjacent dies 115 of a row in the x-direction. Portions of dies on adjacent rows and columns (in the y direction) are also shown.

A die, for example, comprises a rectangular shape. Within the die may be various device regions 118, such as array and logic regions.

A scribe region or line is disposed around a die. For example, scribe lines 120a in the x direction and scribe lines 120b in the y direction separate the dies on the wafer. The scribe lines provide an area for a wafer saw to cut the wafer to singulate the dies. The scribe lines may be, for example, about 50-200 μm in width. Providing scribe lines of other widths is also useful.

The various features and interconnections are strategically placed on the device to minimize the use of space and/or optimize performance. The placement of various features and interconnections is referred to as a product or device layout.

The product layout is contained in an artwork file. The artwork file contains information of the product layout. For example, the various layers of the product are contained in one or more artwork files. The artwork files can be various types of artwork files. The artwork files, for example, can be GDSII, LEF, DEG, OASIS or CIF types of files. Other types of artwork files may also be useful.

In the design process, portions or chiplets of an IC may be contained in individual files. Furthermore, different layers of the chiplets may also be contained in separate files. The different artwork files are combined to produce 3-dimensional information of the complete device of IC.

Figure 2:
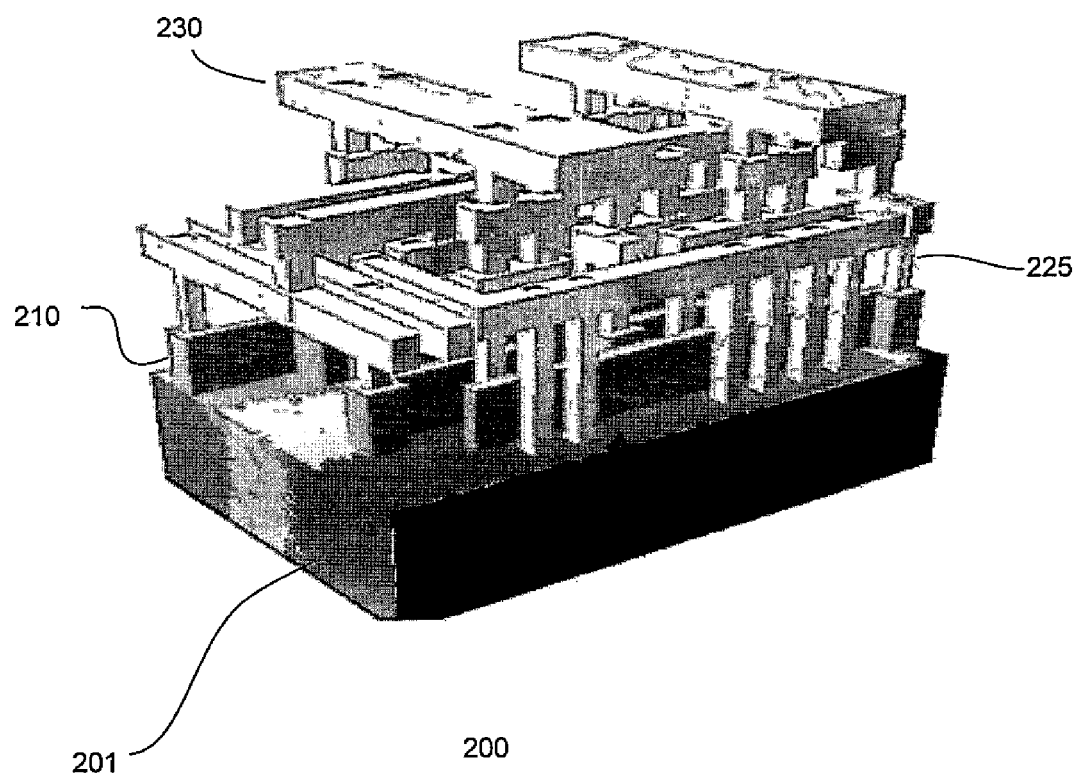
FIG. 2 shows a 3-dimensional rendering of a cell.

FIG. 2 illustrates a 3-dimensional rendering of an example of a cell. The cell includes a substrate 201 with a patterned polysilicon layer 210 which forms polysilicon lines. The polysilicon lines, for example, represent gate electrodes of transistors. Three metal layers 230 are provided in the cell. The metal layers are coupled to the substrate and gates by contacts represented by posts 225.

Figure 3A:
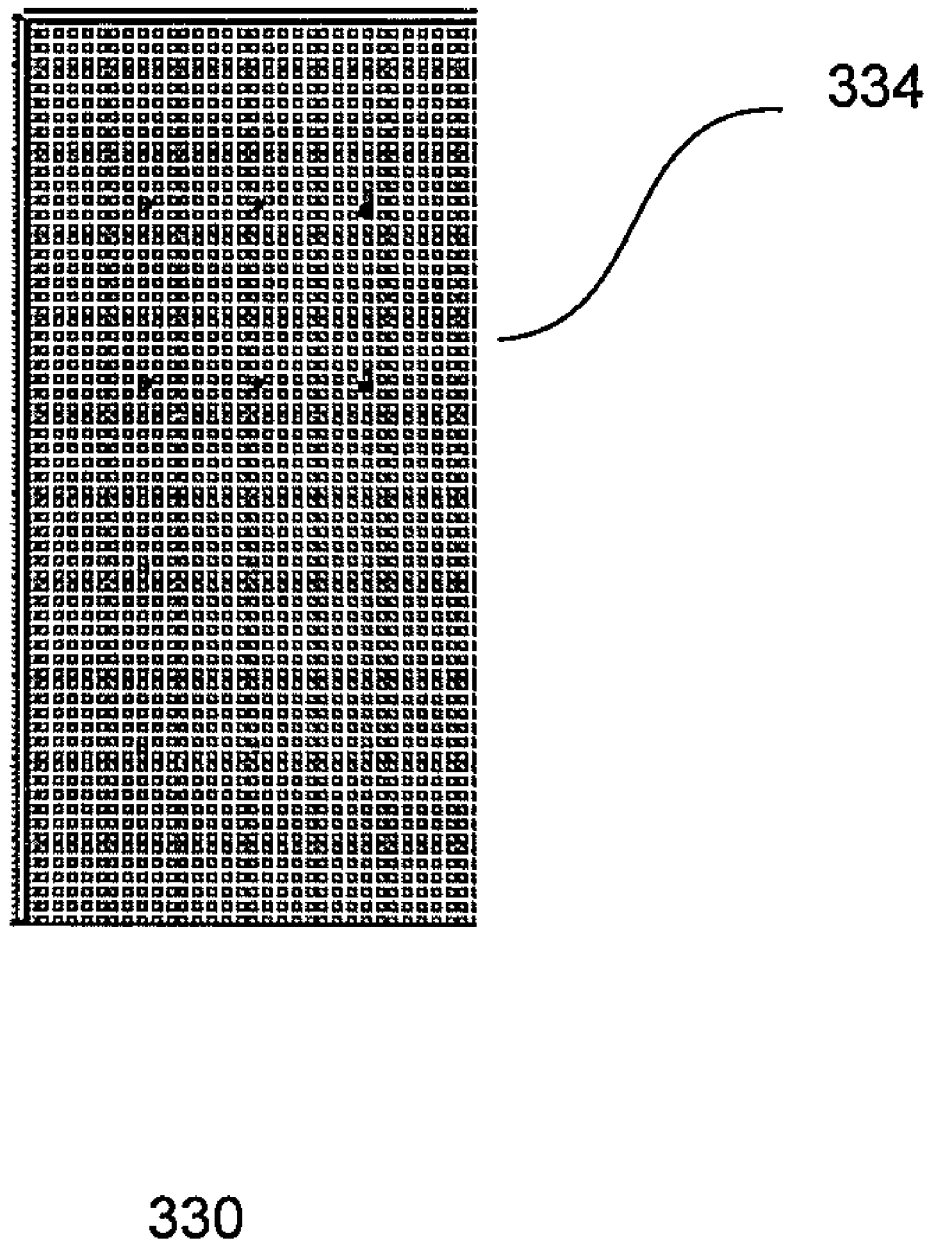
FIGS. 3a-b show embodiments of a test chiplet.

FIG. 3a shows an embodiment of a test chiplet 330 which facilitates defect detection. In one embodiment, the test chiplet facilitates D0 testing. Providing test chiplets which facilitate other types of testing is also useful. The test chiplet can be employed for inline or offline testing. The test chiplet, in one embodiment, comprises a plurality of cells. In one embodiment, the cells are arranged in an array 334. The array may be an M×N array, where M and N are whole numbers. It is understood that M can be equal to or not equal to N. Other arrangements of the cells are also useful.

A cell, for example, comprises patterned structures. Preferably, the patterned structures are similar to those in the actual device or cell. For example, the structures of the cell should have characteristics of structures of the actual device, such as, for example, pitch, critical dimension (CD) and density.

Figure 3B:
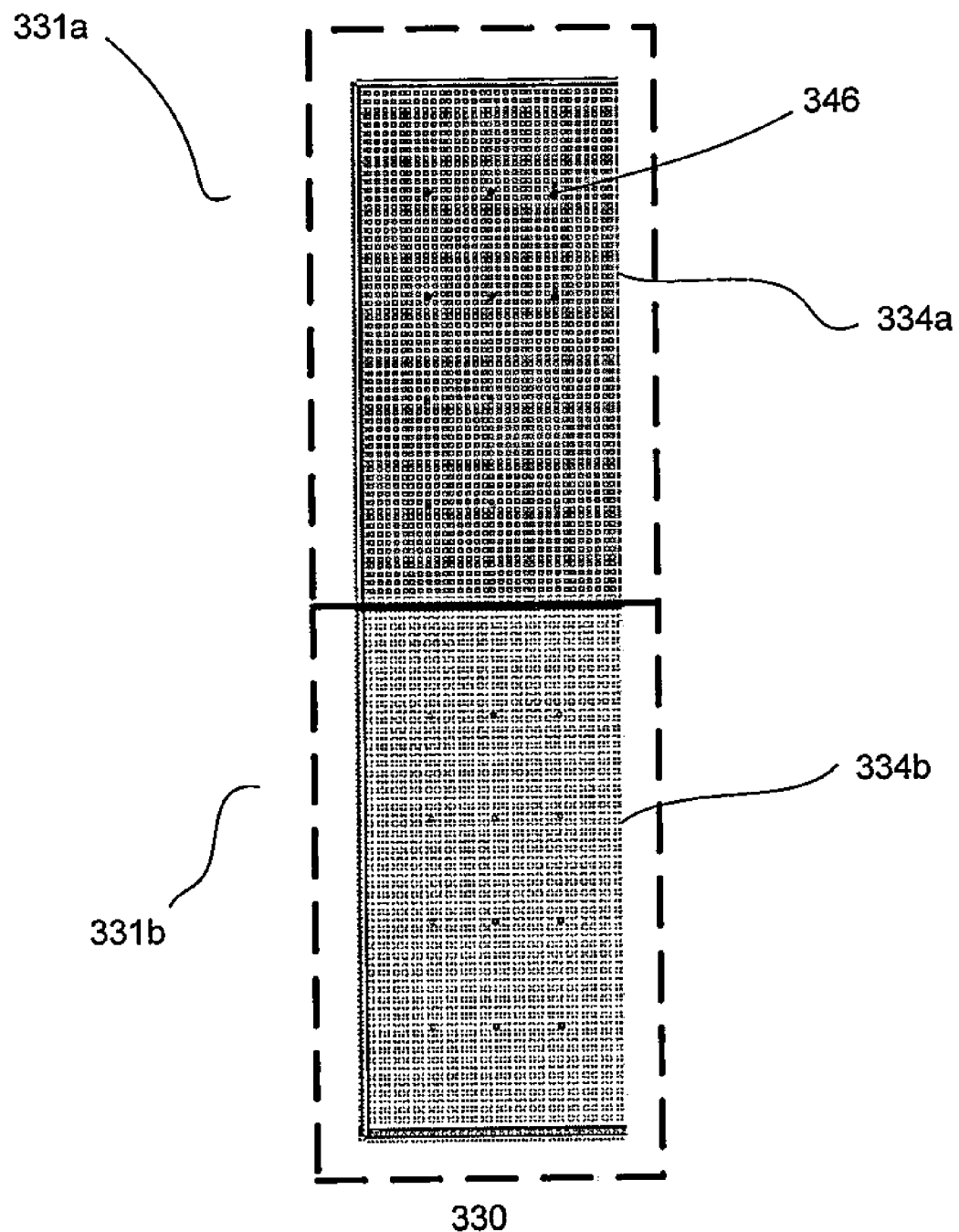

In one embodiment, the array comprises identical cells. Providing an array with identical cells may be advantageous since it may more closely simulate overall structure or conditions of an actual chiplet or portion of a device. Alternatively, the array may comprise different types of cells. In other embodiments, the test chiplet may include a plurality of sub-regions with sub-arrays of cells. In one embodiment, a sub-array comprises identical cells. Providing a plurality of sub-regions allows for different types of cells to be included in the test chiplet. For example, as shown in FIG. 3b, a test chiplet 330 comprises first and second sub-regions 331a-b with first and second sub-arrays of cells 334a-b. Providing a test chiplet with other cell arrangements may also be useful.

In one embodiment, at least one cell of the test chiplet is programmed with a defect 346. For example, a cell is intentionally designed with a defect. In one embodiment, one defect is programmed in a cell. The defects preferably include subtle defects which may be difficult to detect. For example, the signal-noise ratio of subtle defects may be marginal, making them difficult to detect. Such defects may include defects related to bridging or broken patterns. Depending on the layer of the device, the defects may be related to active areas on the substrate, polysilion lines, contacts or vias, or metal lines.

By programming defects into the cells, the types of defects and their locations are known. This facilitates development of detection recipes from detection tools which can be tailored to detect subtle defects. Various types of detection tools may be employed. For example, inspection tools may be optical or ebeam inspection tools. Optical inspection tools may include a Brightfield Inspector from KLA or an UVision from AMAT while ebeam inspection tools may include an eScan3xx from HMI, an eS3x from KLA or a SemVision from AMAT. Other types of inspection tools are also useful.

Figure 4A:
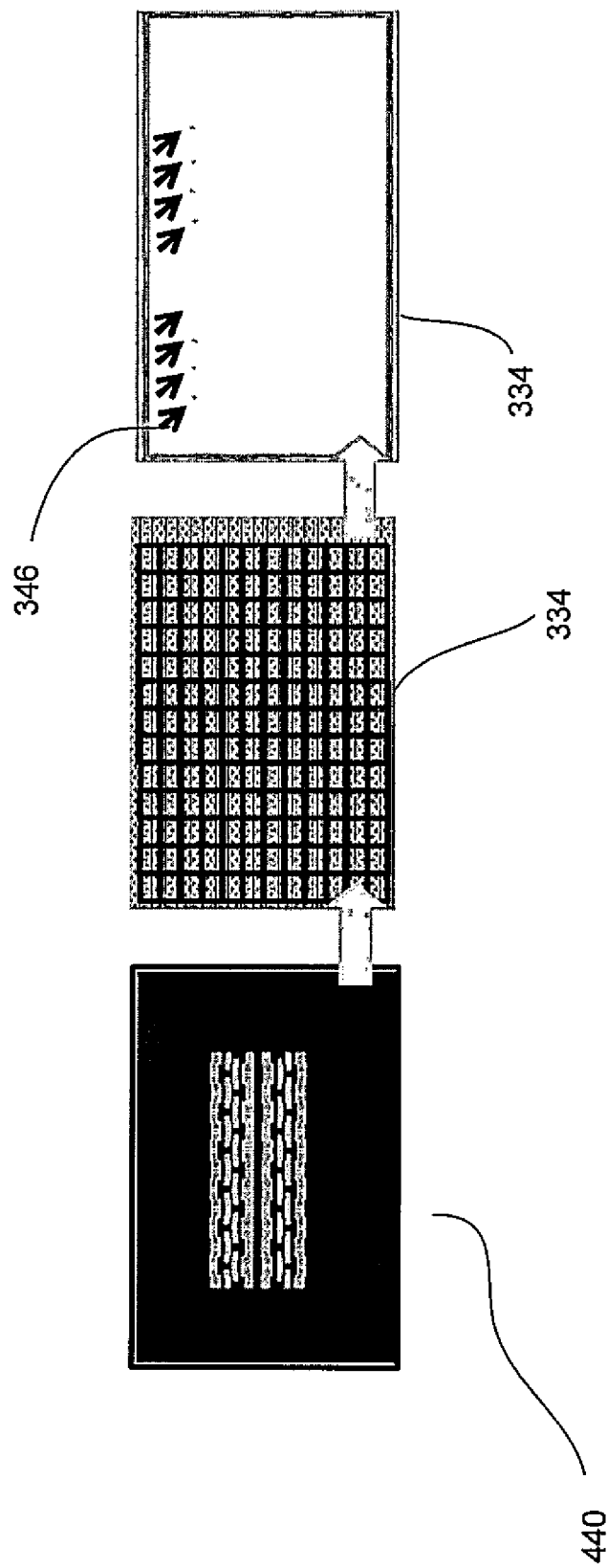
FIGS. 4a-b show an embodiment of a cell.

FIG. 4a shows an exemplary embodiment of a cell 440. The cell may comprise an active unit cell structure of a device. For example, the cell may comprise an SRAM unit cell structure at the active level. A plurality of cells are arranged to form an M×N array 334 of the test chiplet. For example, the cells are arranged in a 12×13 array. In one embodiment, at least one defect 346 is designed into one of the cells of the array. As shown, defects 346 are designed into some of the cells of the array. In other embodiments, all the cells of the array may be designed with defects.

Figure 4B:
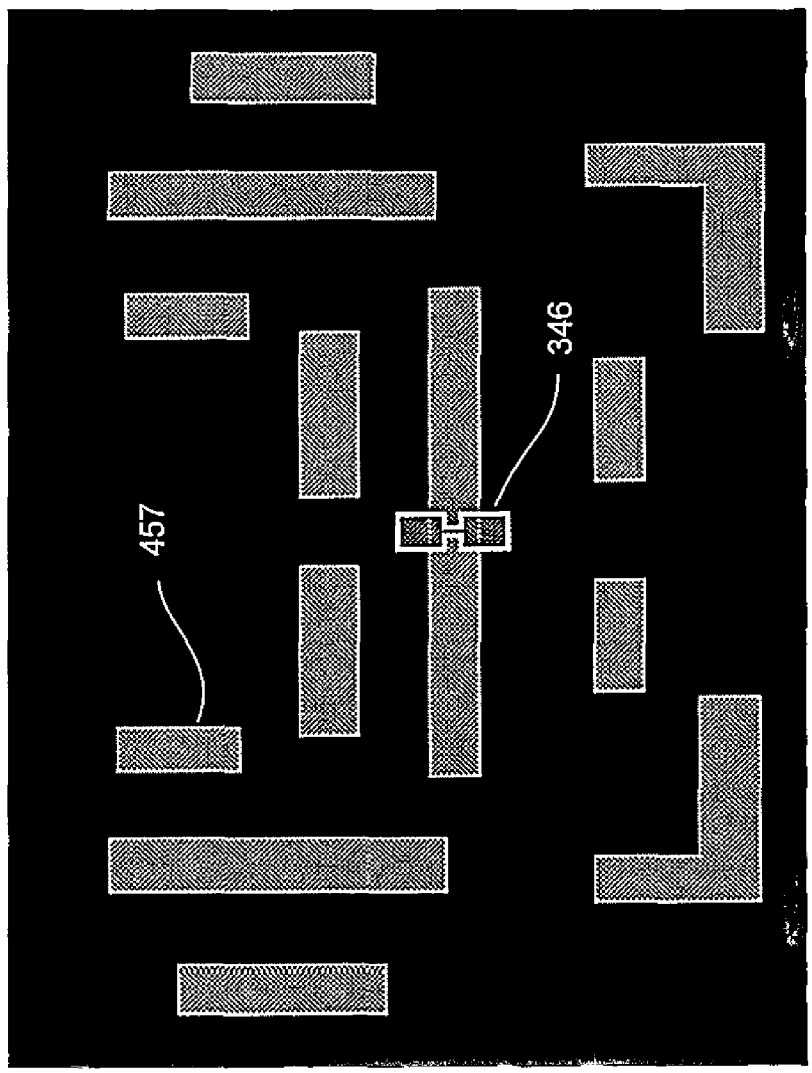

FIG. 4b shows an exemplary embodiment of a cell 440 in greater detail. As shown, the cell comprises active lines 457. The active lines, for example, are similar to critical active line structures that exist in the device, such as in the logic area of a device. The critical line structure may include known weak points of a designed pattern or core working structures that determine a functionality of the particular device. Other types of structures are also useful.

A defect 346 is intentionally designed into one of the structures. The defect, for example, comprises narrowing the line to cause an open line in the resulting structure on the test chiplet. Without the defect designed in, the resulting structure would be a continuous line. Designing other types of defects into the cell is also useful. For example, bridging or electrical shorts can be designed into two separate lines.

Figure 5:
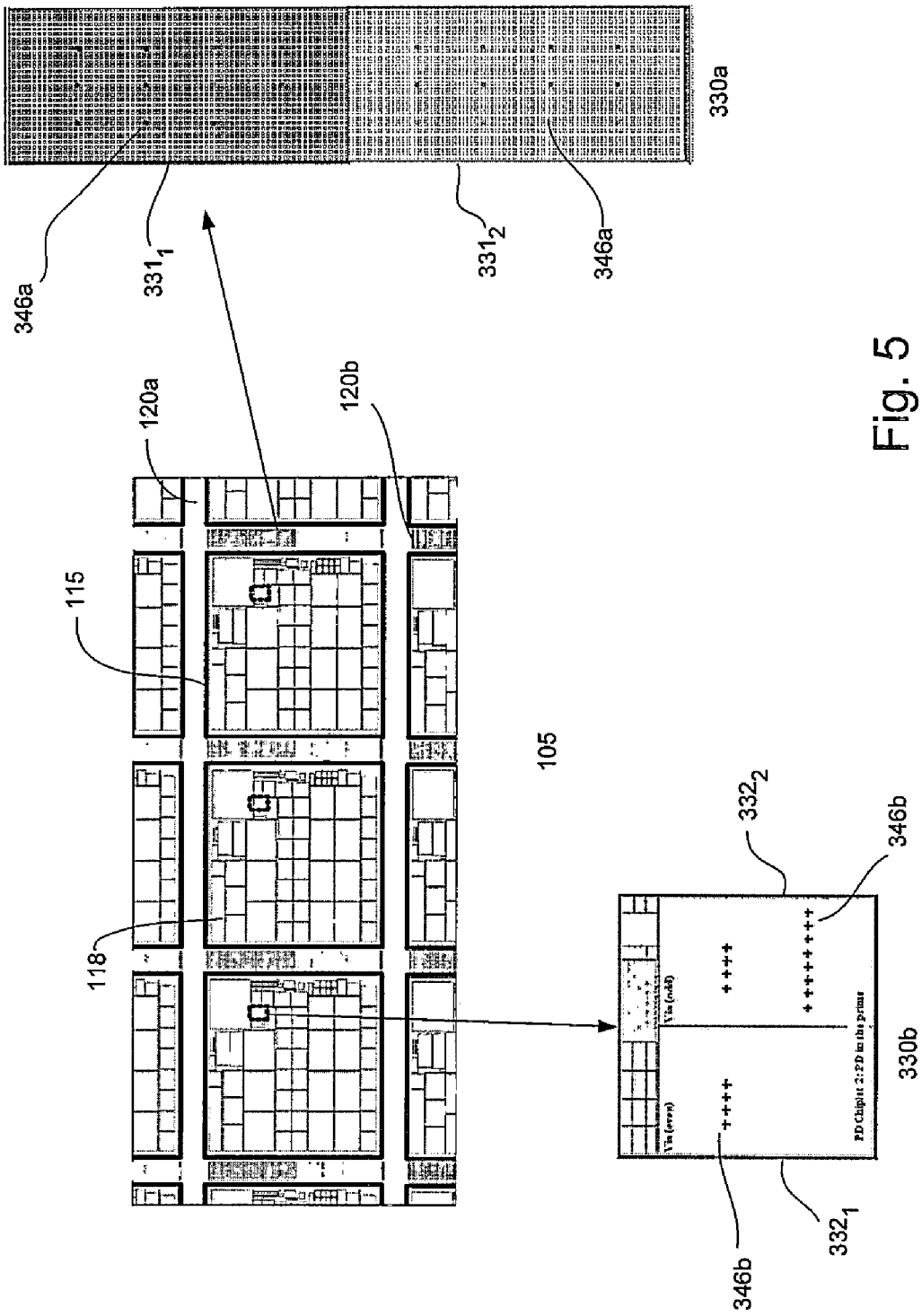
FIG. 5 shows a portion of a wafer.

FIG. 5 shows a portion 105 of the wafer, similar to that of FIG. 1b. As shown, the portion comprises three adjacent dies 115 of a row in the x-direction. Portions of dies on adjacent rows and columns (in the y direction) are also shown. A die, for example, comprises a rectangular shape. Within the die may be various device regions 118, such as arrays and logic regions. First scribe lines 120a in the x direction and second scribe lines 120b in the y direction separate the dies on the wafer.

In one embodiment, a test chiplet 330a is disposed in the scribe region of the wafer. The test chiplet comprises a plurality of sub-arrays 331 of cells programmed with defects 346a. The test chiplet, for example, comprises first and second sub-arrays $331_1$ and $331_2$. As shown, the test chiplet is disposed on the second scribe regions 120b in the y direction adjacent to the die. Placing test chiplets in the first scribe regions or both first and second scribe regions is also useful. Alternatively, one or more test chiplets 330b can be disposed within a die. The test chiplet, for example, comprises first and second sub-arrays $332_1$ and $332_2$ having cells with via structures. The test chiplet is programmed with defects 346b. In other embodiments, test chiplets can be disposed both within the dies and in the scribe regions. Disposing the test chiplet within the die may more accurately reflect structures of the die but at the expense of increased die size.

FIGS. 6a-f show various examples of simulations of programmed defects 346 and corresponding printed patterns on a substrate with an actual defect 646.

Figure 6A:
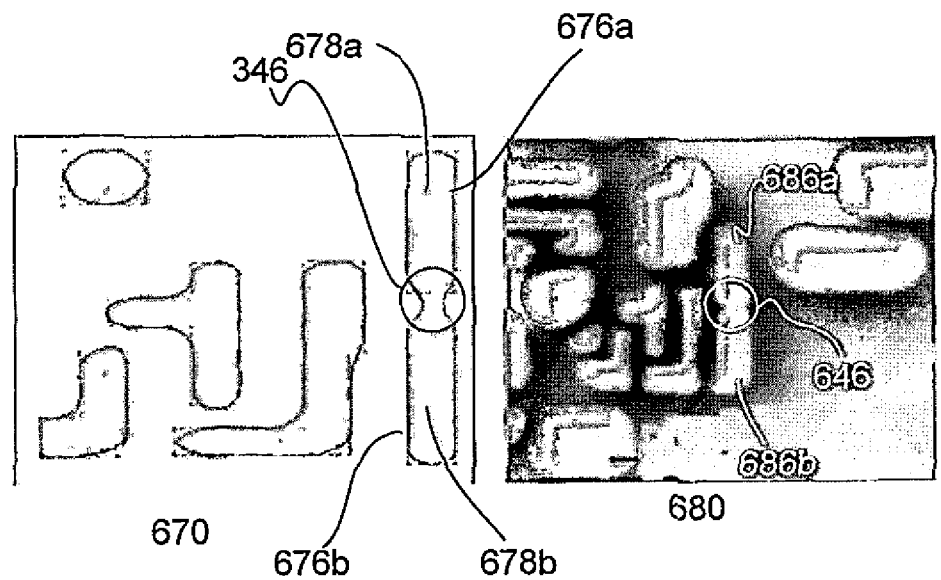
FIGS. 6a-f show examples of simulations of programmed defects and corresponding printed patterns on a substrate with an actual defect.

Referring to FIG. 6a, a simulation 670 of various structures of a cell with the intended patterns 676a-b is shown. The structures, as shown, are structures at the active layer of the cell. As shown, the intended patterns of the structures have geometric shapes which include straight lines or corners. The intended patterns may be modified by, for example, optical proximity correction techniques, to produce a structure on the substrate with the modified pattern. The modified patterns 678a-b, for example, may include rounded corners and/or changes in widths. Based on the simulation, a mask is formed which is used to replicate or print the pattern 680 onto a substrate or wafer.

In accordance with one embodiment, a defect 346 is programmed into the cell. As shown, the defect bridges two separate features 676a-b. The defect 646, when printed onto a substrate, causes bridging or shorting of two features 686a-b together.

Figure 6B:
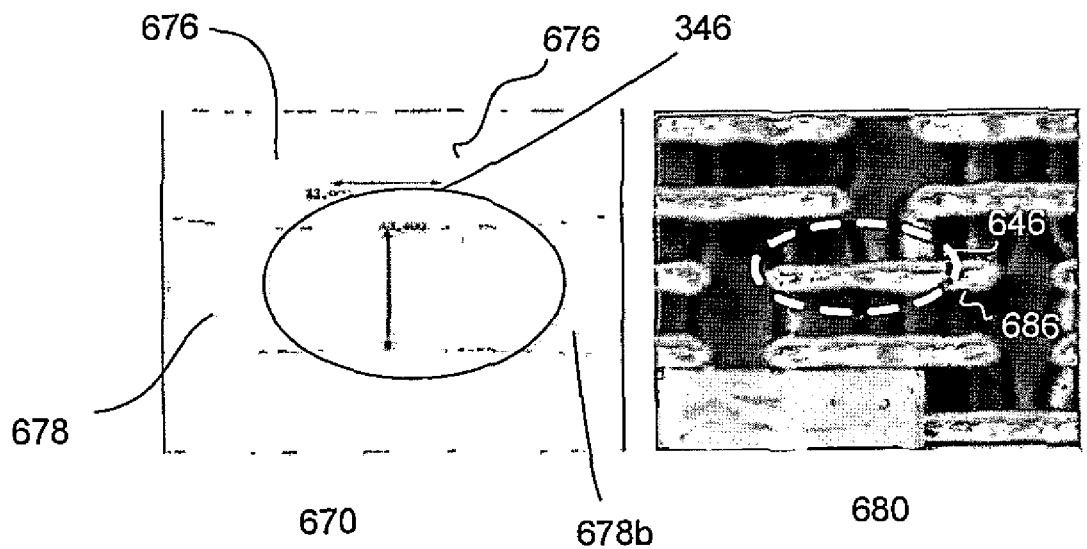

In FIG. 6b, a simulation 670 of a structure of a cell with the intended pattern 676 is shown. The structures, as shown, are structures at the polysilicon layer of the cell. The intended structure may comprise a polysilicon line corresponding to, for example, a gate conductor. A defect 346 is programmed into the cell. The defect 646, when printed onto a substrate, causes necking of a structure. This increases resistance of the polysilicon line. Under extreme process conditions, the defect may cause an open in the polysilicon line.

Figure 6C:
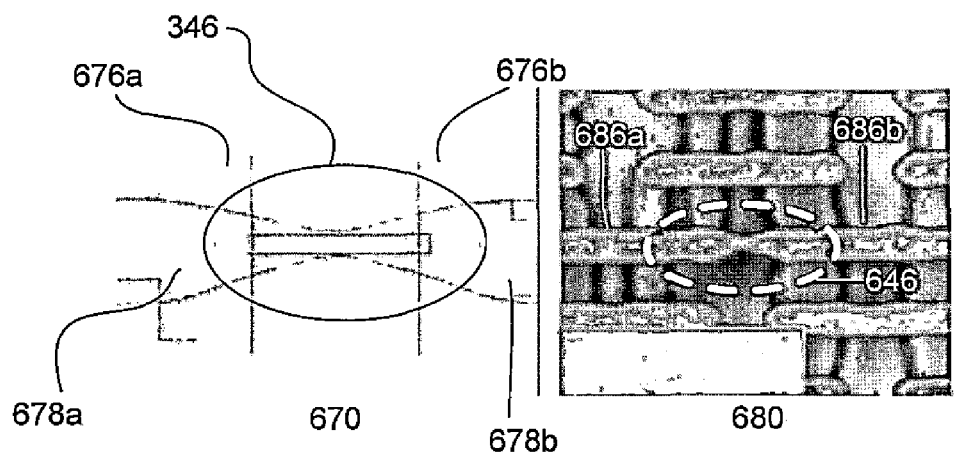

In FIG. 6c, a simulation 670 of two separate structures of a cell with the intended patterns 676a-b is shown. The structures, as shown, are structures at the polysilicon layer of the cell. The intended structures may comprise polysilicon lines corresponding to, for example, gate conductors. A defect 346 is programmed into the cell. The defect 646, when printed onto a substrate, causes bridging or shorting of two polysilicon lines 686a-b.

Figure 6D:
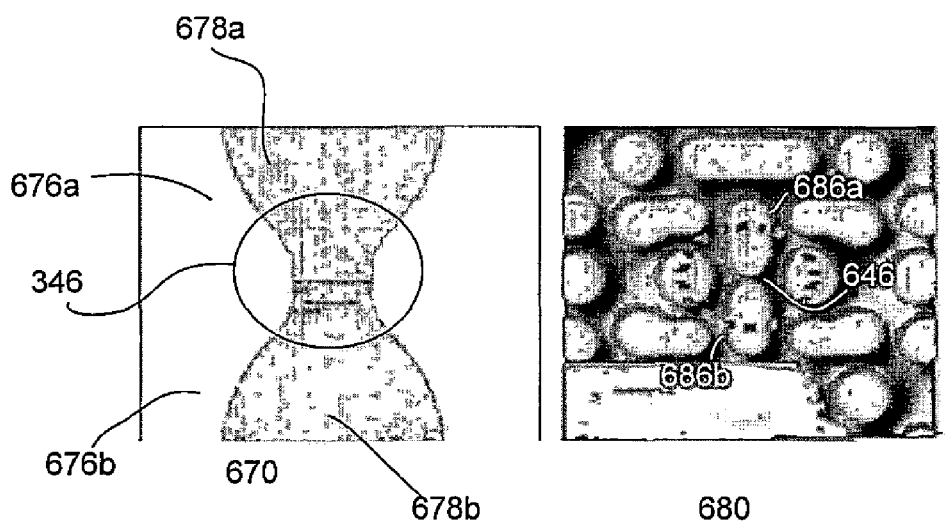
Figure 6E:
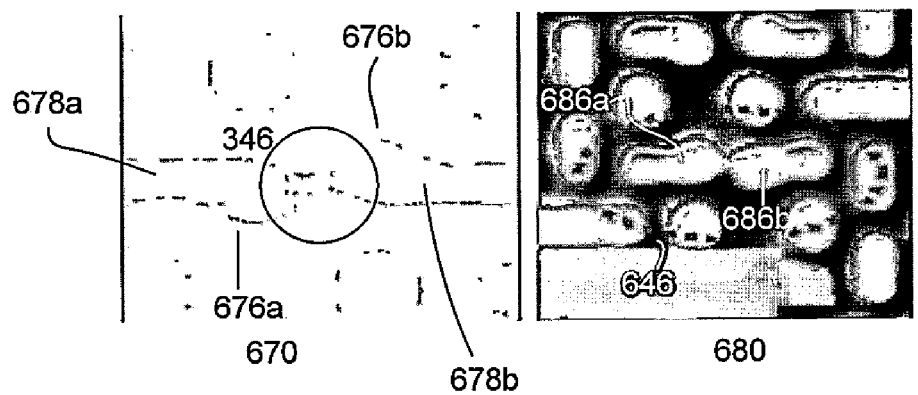

FIGS. 6d-e illustrate a simulation of intended patterns 676a-b of two structures. The structures, as shown, are structures at the metal layer of the cell. The two structures include a defect 346 which connects the two structures. Modified patterns 678a-b created by, for example, optimal proximity correction (OPC) are shown. The printed pattern 680 on the substrate shows the two separate features being too close together as a result of the defect 646, which can cause leakage.

Figure 6F:
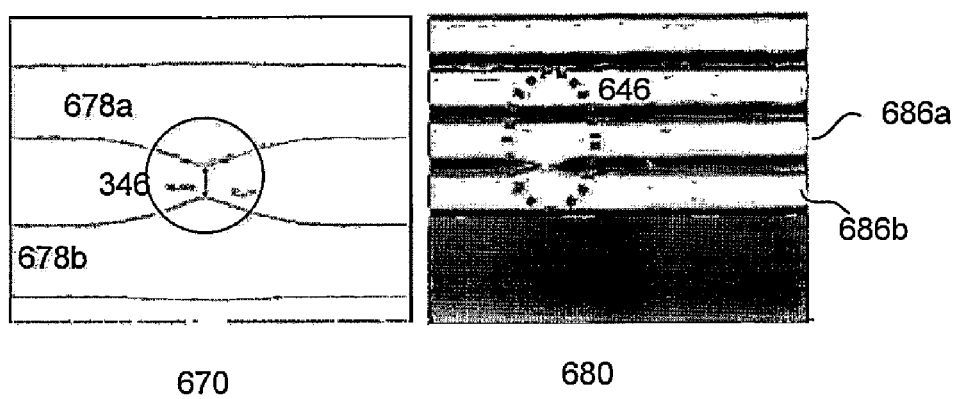

Referring to FIG. 6f, a simulation of two line features 678a-b is shown. A defect 346 is programmed between the two lines. The printed pattern 680 shows that the two lines are bridged due to the defect 646.

FIGS. 7a-l show various other examples of programmed defect design patterns or structures and corresponding printed patterns on a substrate.

Figure 7A:
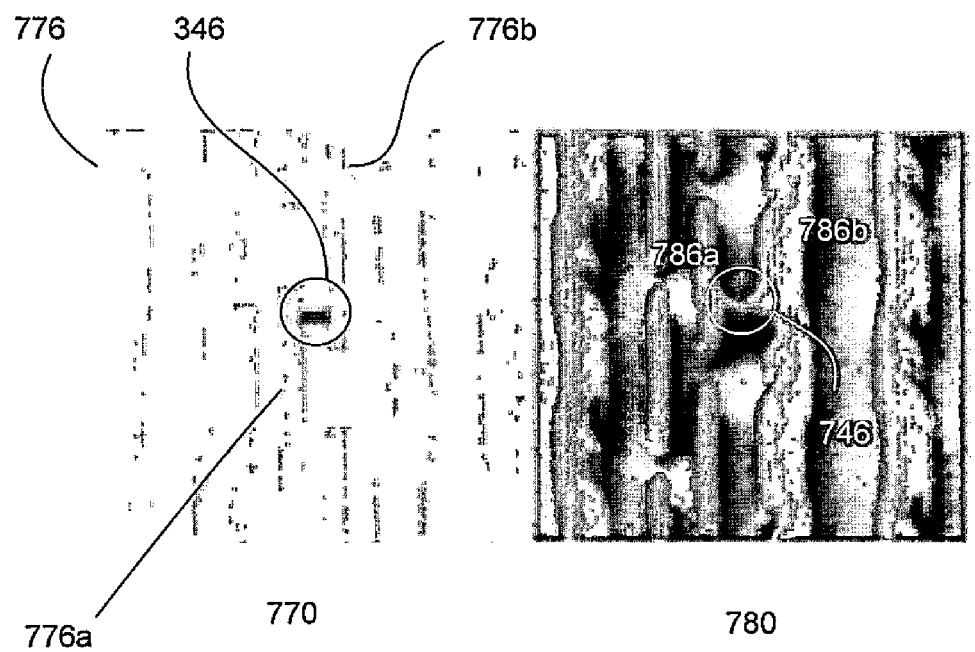
FIGS. 7a-l show other examples of simulations of programmed defects and corresponding printed patterns on a substrate.
Figure 7B:
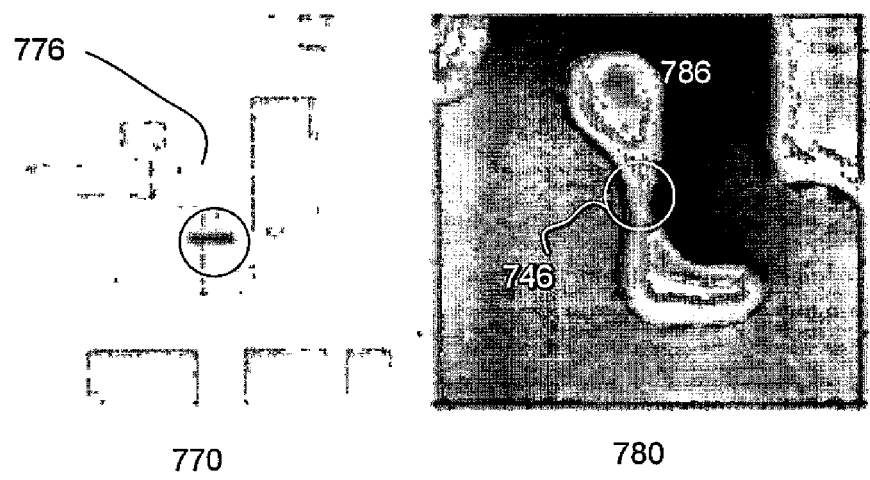

Referring to FIGS. 7a-b, design patterns or structures 770 and corresponding actual printed patterns 780 of active layers of cells are shown. As shown, the design structures include patterns of active area features 776. A defect 346 is programmed into the cell. In FIG. 7a, the defect produces a bridge 746 between two features 786a-b on the substrate, creating a short. On the other hand, the defect in FIG. 7b produces a neck 746 within a feature 786, increasing resistance or forming an open connection.

Figure 7C:
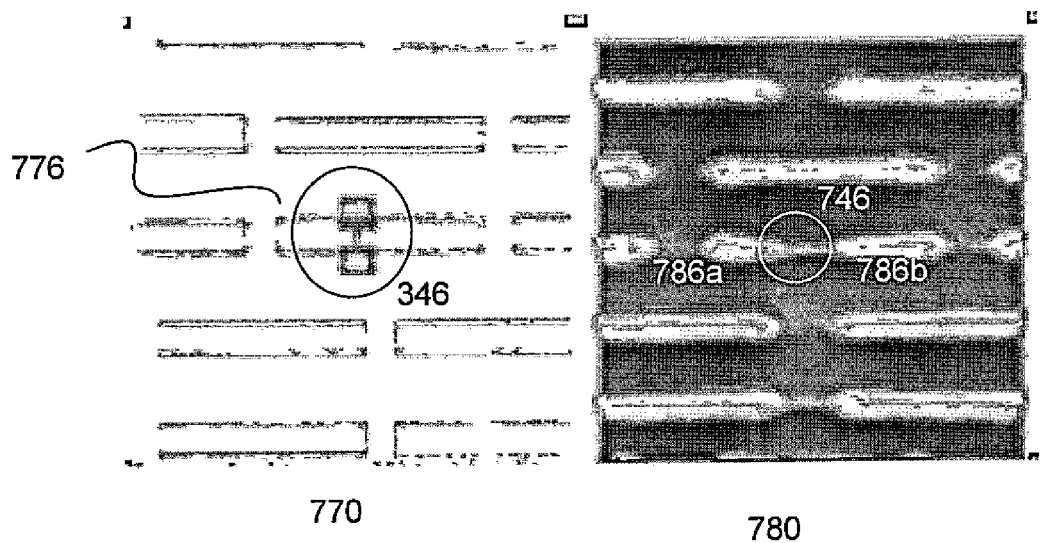
Figure 7D:
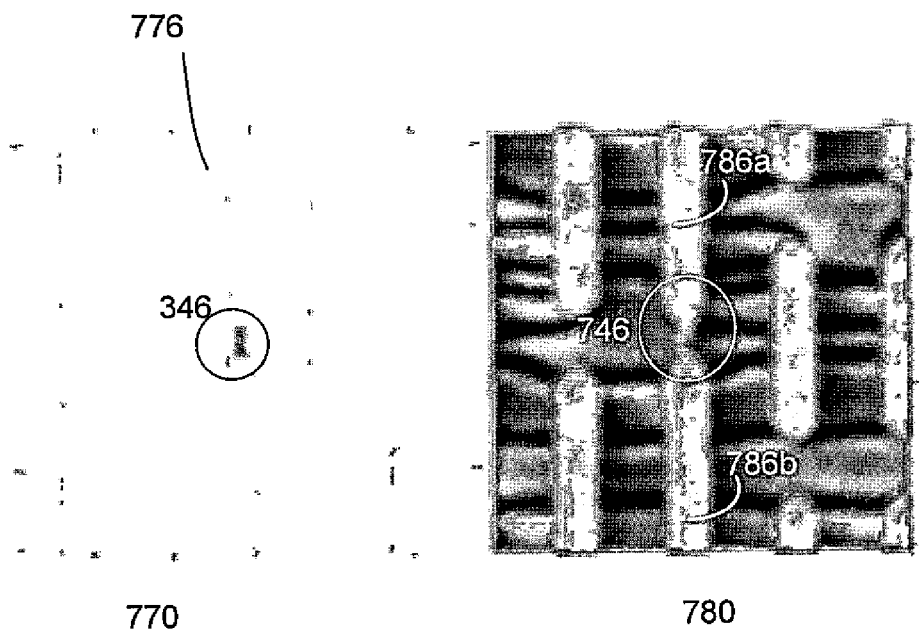

In FIGS. 7c-d, design structures 770 and corresponding actual printed patterns 780 from polysilicon conductor layers of cells are shown. As shown, the design structures include patterns of gate conductor features 776. Defects 346 are programmed into the cells. In FIG. 7c, the defect produces a neck 746 within a conductor 786, increasing resistance or forming an open connection. In contrast, the defect in FIG. 7d produces a bridge 746 between two gate conductors 786a-b on the substrate, creating a short.

Figure 7E:
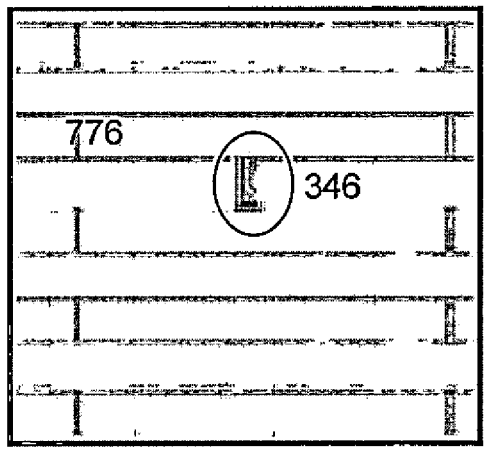
Figure 7E:
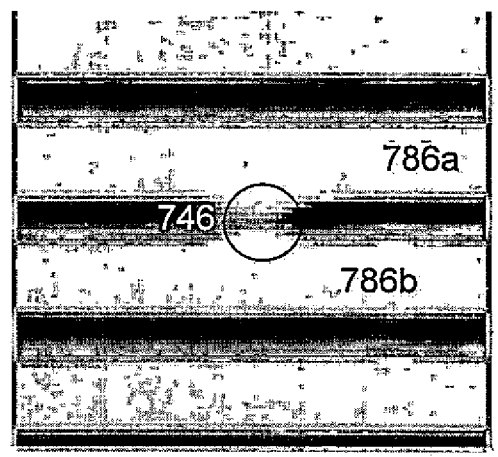
Figure 7F:
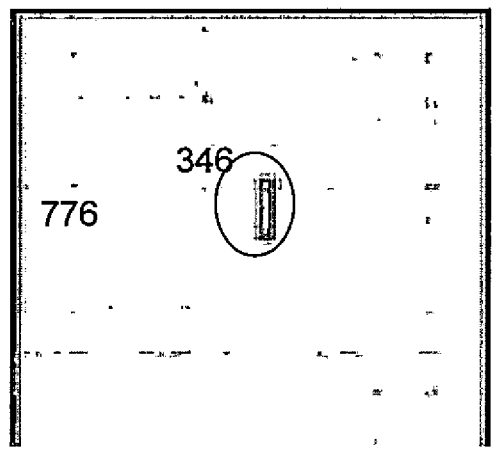
Figure 7F:
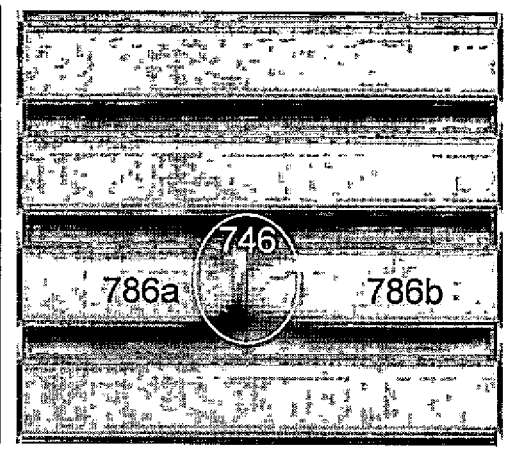
Figure 7G:
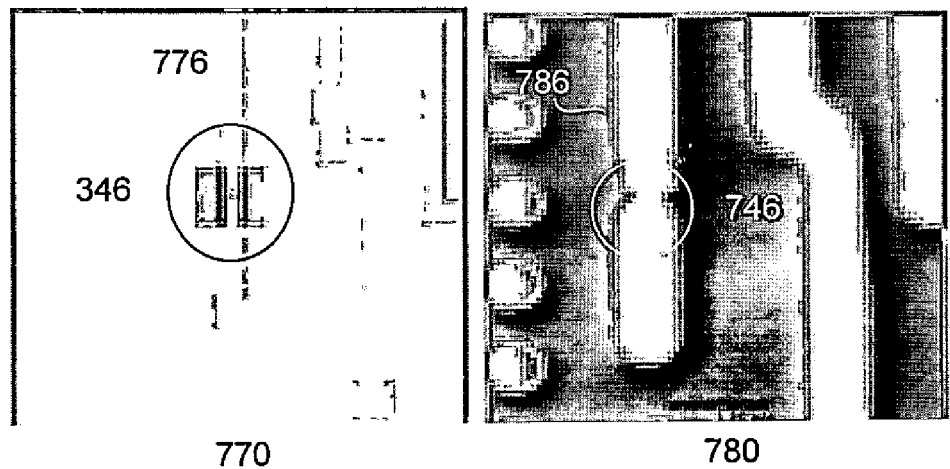
Figure 7H:
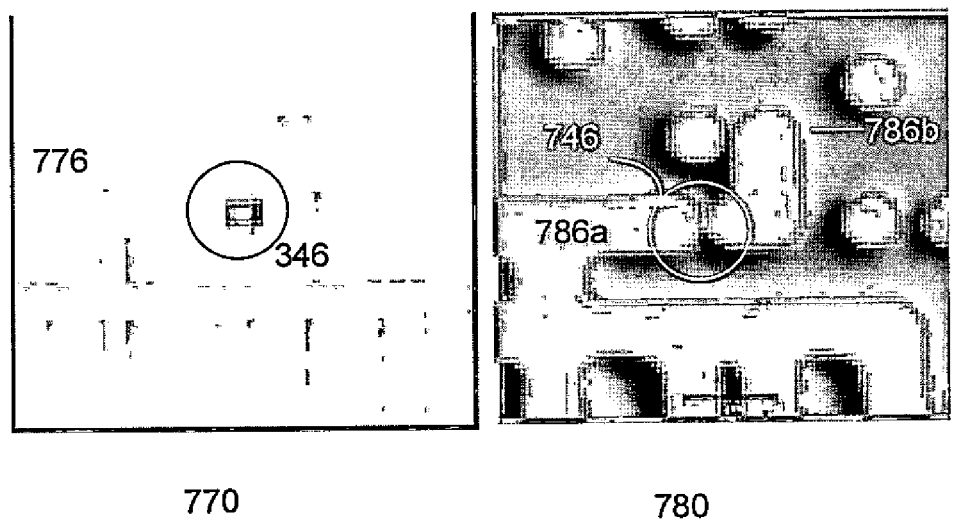

As for FIGS. 7e-h, design structures 770 and corresponding actual printed patterns 780 from, for example, interconnect layers of cells are shown. The design structures and printed patterns, alternatively, may correspond to other process layers. For example, the design structures and printed patterns may correspond to the active layer, polysilicon layer, implant layer or a combinations thereof, including interconnect layers. The design structures include patterns of parallel line structures 776. Defects 346 are programmed into the cells. In FIGS. 7e and 7h, the defects produce bridges 746 between two adjacent structures or lines 786a-b on the substrate, creating shorts. In FIGS. 7f and 7g, the defects produce necks 746 within the features 786, increasing resistance or forming an open connection.

Figure 7I:
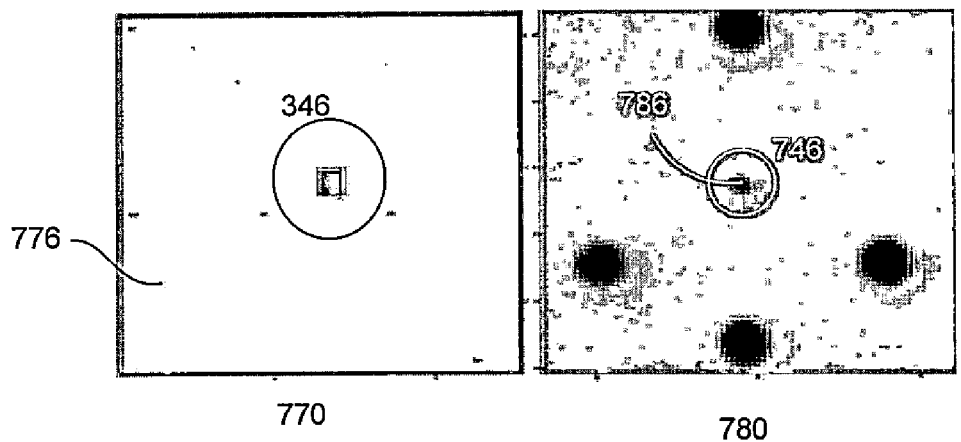
Figure 7J:
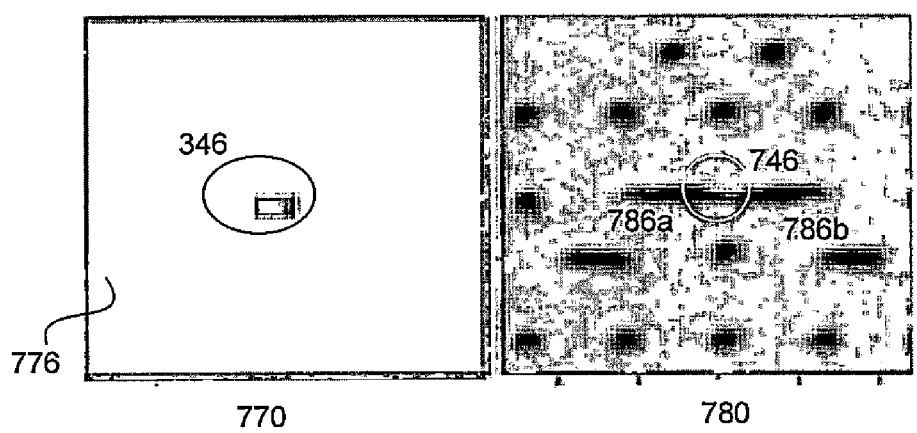
Figure 7K:
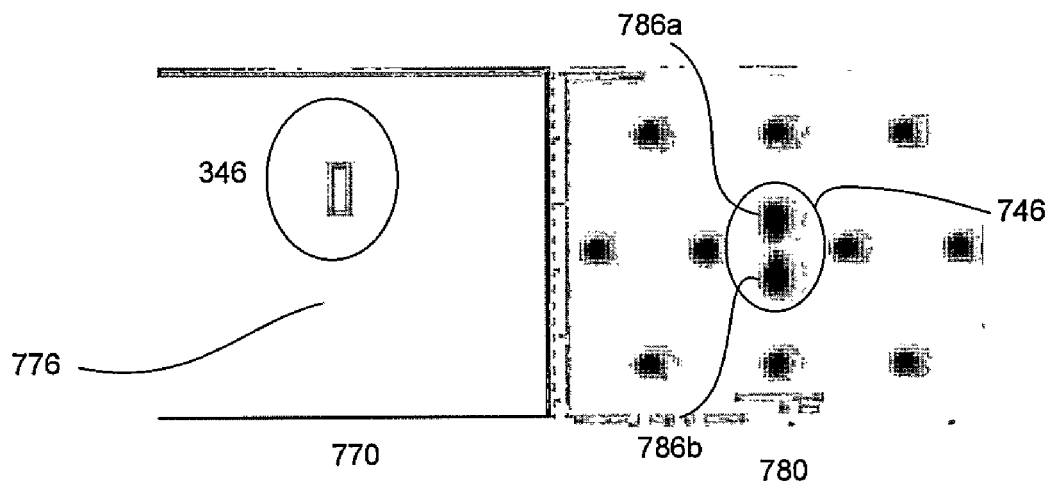
Figure 7L:
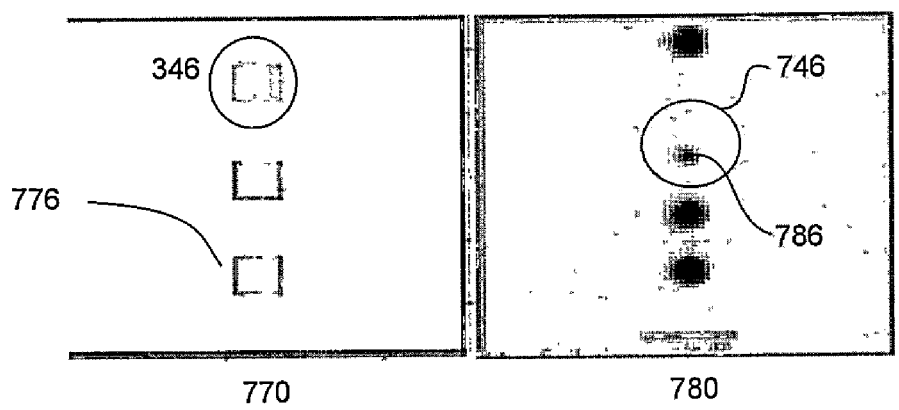

Referring to FIGS. 7i-l, design structures 770 and corresponding actual printed patterns 780 from contact or via levels of cells are shown. The design structures include patterns of contacts or vias 776. Defects 346 are programmed into the cells. In FIGS. 7i and 7l, the defects 746 produce missing contact holes due to the reduced size 786. This results in increased resistance or open connections. In FIGS. 7j-k, the defects produce merged contact holes due to enlarged vias or extension via holes. This results in shorts or leakage.

Figure 8:
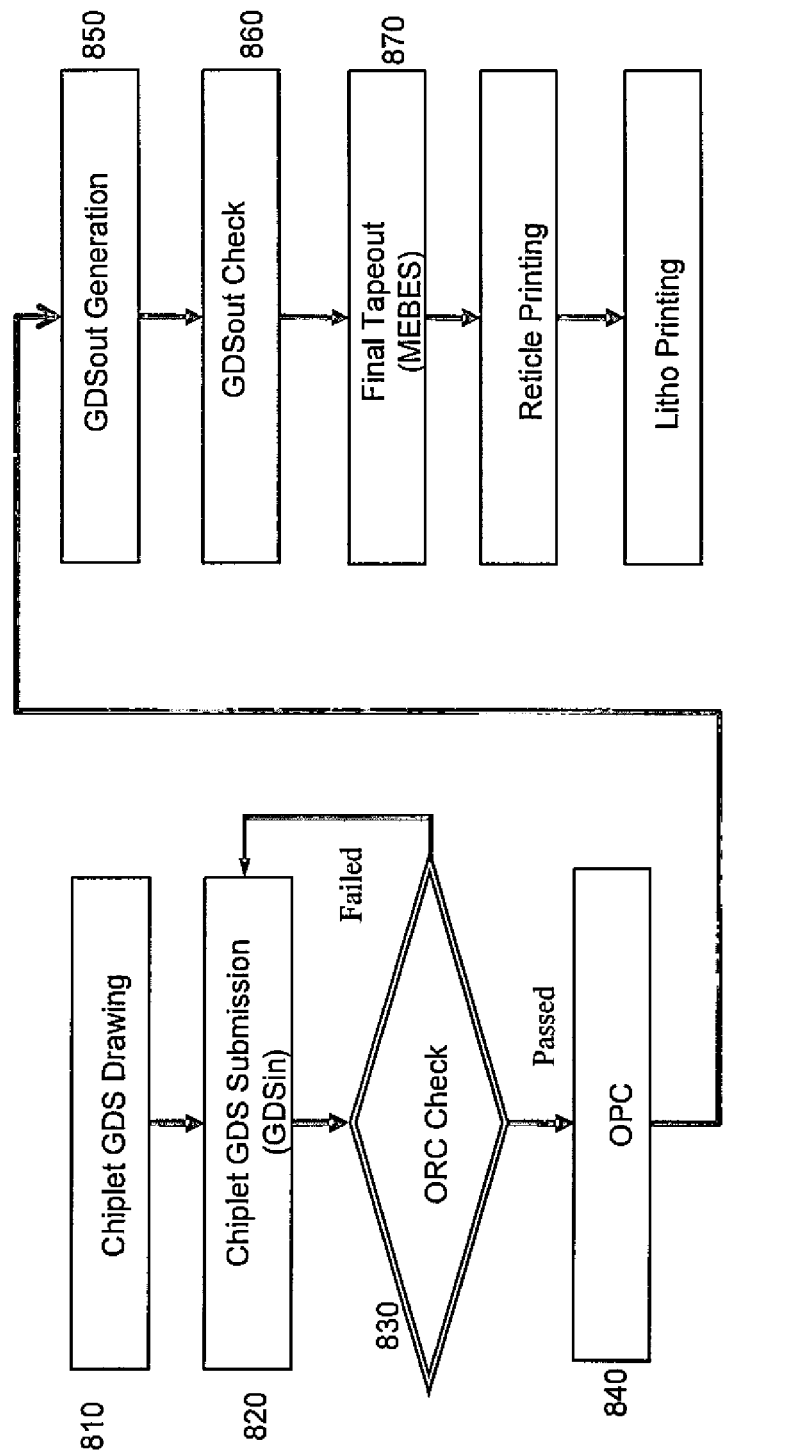
FIG. 8 shows an embodiment of a tapeout process flow of a device.

FIG. 8 shows an embodiment of a tapeout process flow 800 of a device. The process commences at step 810 by creating a 3-dimensional artwork file containing the layout of the device. The artwork file can be various types of artwork files. The artwork file, for example, can be a GDSII (GSD), LEF, DEG, OASIS or CIF type of file. Other types of artwork files may also be useful.

In one embodiment, the artwork file contains layout information of all the different layers of the device. In one embodiment, the layout information of the different layers of the device is contained in a GDS file. The layout information of the device may be contained in numerous artwork files. For example, the device may be divided into numerous chiplets corresponding to different artwork files. In some embodiments, the different layers of a device or chiplets may be contained in individual artwork files. Other artwork file arrangements for the layout of the device may also be useful.

At step 820, an artwork file (GDSin) is submitted for processing. The processing includes, in one embodiment, checking the artwork file for correctness at step 830. In one embodiment, checking comprises an optical rule correction (ORC) check. This, for example, involves checking to see if the design patterns violate any design rule. The ORC checks to see if the design pattern includes adjacent structures that are too close which may cause merging or bridging or a structure that is too thin such that process margins may not be able to print it out on the physical wafer. If the artwork file fails ORC check, the process returns to step 820 for further modification until the artwork file passes ORC check.

After the GDSin file passes ORC check, optical proximity correction (OPC) is performed at step 840. As discussed, the GDSin file contains layout information of all layers of the device or chiplet. OPC, for example, systematically modifies the geometry of features in the artwork file. These modifications are used to create masks with a mask geometry which compensates for optical proximity effect to achieve the desired pattern on the actual wafer. Various types of OPC techniques can be used. For example, OPC techniques can include those described in the co-pending application U.S. Ser. No. 11/943,591, filed on Nov. 21, 2007 which is herein incorporated by reference for all purposes. Other types of OPC techniques may also be employed.

In one embodiment, the GDSin file containing all the layers is delayered prior to being processed by OPC. For example, the artwork file is delayered into a plurality of artwork sub-files, each containing a layer of the device or chiplet. OPC is then performed on the artwork sub-files. OPC, for example, is performed on the artwork sub-files individually.

At step 850, a plurality of GDSout files may be generated corresponding to the different layers of the device or chiplet. The GDSout files are checked at step 860. Checking of the GDSout files comprises, for example, determining whether the OPC pattern generated produces the desired patterns to create the device as designed. Checking can be accomplished, in one embodiment, by Jobview. Jobview, for example, is performed in Reflexion X. Other types of checking tools may also be useful.

The process steps 820-860 are repeated until all GDSin files of the device are processed to create a plurality of GDSout files corresponding to the layout of the device. For example, GDSout files can correspond to different layers of different chiplets. After all the GDSout file are checked, final tapeout is performed at step 870. The tapeout, for example, produces an MEBES file from assembling all the GDSout files of the device. The MEBES file is used to create the mask set used for fabricating the actual device.

Figure 9A:
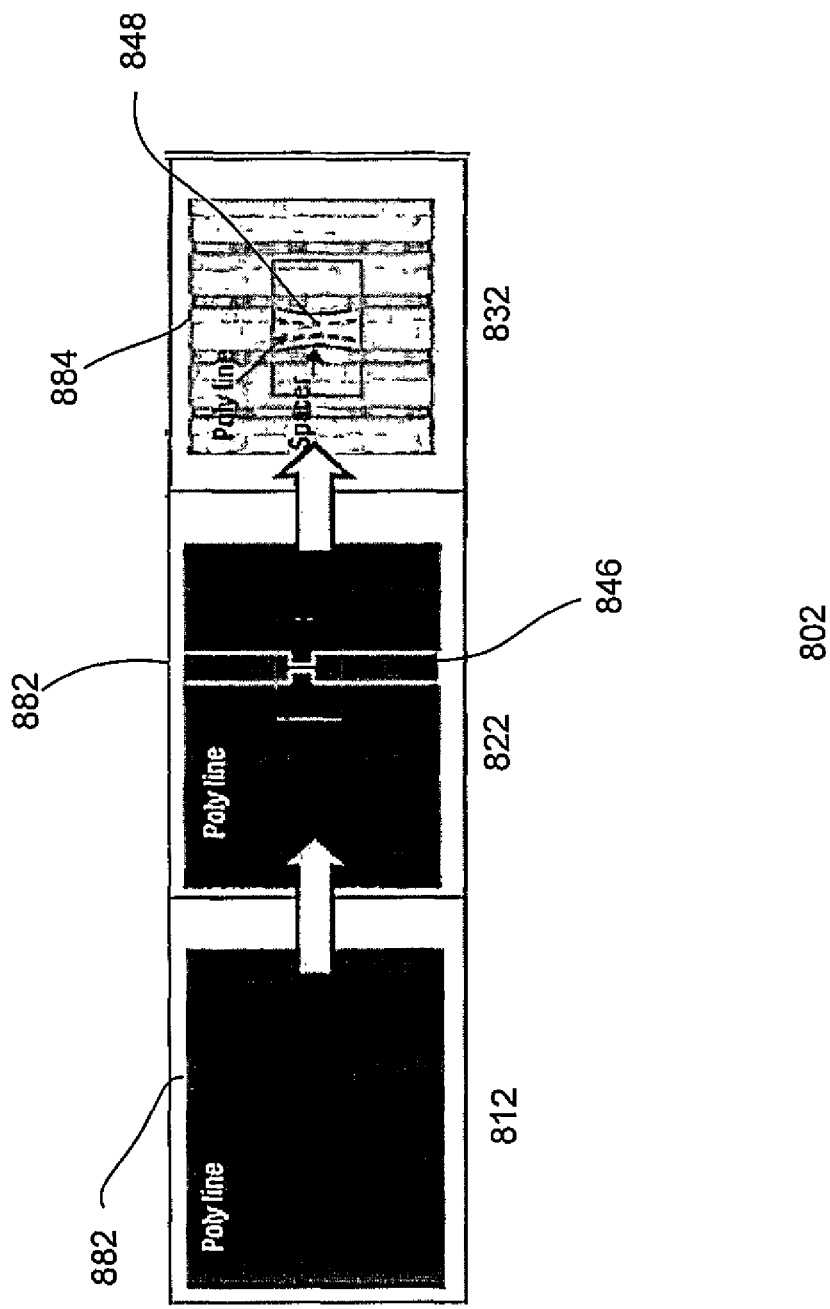
FIGS. 9a-b show embodiments of processes for incorporating a defect into a cell.

FIG. 9a shows a process 802 for incorporating a defect into a cell. The process involves drawing the defect in an artwork file. At step 812, an artwork file is provided. The artwork file, for example, comprises a GDS file. Other types of artwork files are also useful. The artwork file may comprise a test chiplet with an array of test cells. The array of cells includes standard cells with patterns corresponding to standard structures or features. For example, the array of cells contains process of record (POR) structures. A portion of a test cell is shown. The patterns may correspond to polysilicon structures at the polysilicon layer. For example, as shown, the test cells may comprise patterns corresponding to polysilicon line structures 882. The cell may include patterns of other types of structures, such as structures of other layers. For example, the structures may be interconnect lines of an interconnect layer, vias or contacts of a via or contact layer or active structures of an active layer.

At step 822, a defect 846 is programmed into a cell of the array of cells. In one embodiment, the defect is drawn into the cell. A user may open the artwork file and may draw the defect into the cells. For example, a feature at the desired location is deformed to create the intended defect. As shown, the defect in the cell comprises narrowing a line feature pattern. This may result in necking in the actual line feature, which increases resistance or creates an open connection in the line feature. Other types of defects may also be useful. For example, the defect may comprise widening or extending a line feature pattern. This may result in bridging which may cause current leakages or shorts in the actual line features produced. Additional defects may be programmed into the array of test cells. For example, additional defects may be programmed at desired locations of other cells. The defects of the array need not be of the same type of defects. For example, different cells of the array may have different types of defects.

A mask can be created based on the information in the artwork file. The mask can be employed to form a physical layer with the desired pattern on a wafer at step 822. A physical defect 848 exists in the polysilicon line 884 on the wafer corresponding to the programmed defect. As can be seen, the defect is a narrowing of the polysilicon line which results in increased resistance.

The defects can be drawn into the artwork file at various stages of the tapeout process flow. For example, the defects can be drawn into the input artwork file, such as GDSin. The defects can be drawn into the respective layers of the array of cells in the GDSin file. In other embodiments, the defects can be drawn into the artwork file after OPC has been performed on the artwork file. For example, the defects can be drawn into the GDSout file right after OPC has been performed or into the MEBES file used to form a mask set for the device. In the case of the MEBES files, the defects can be drawn into the respective layers of the array of test cells.

Figure 9B:
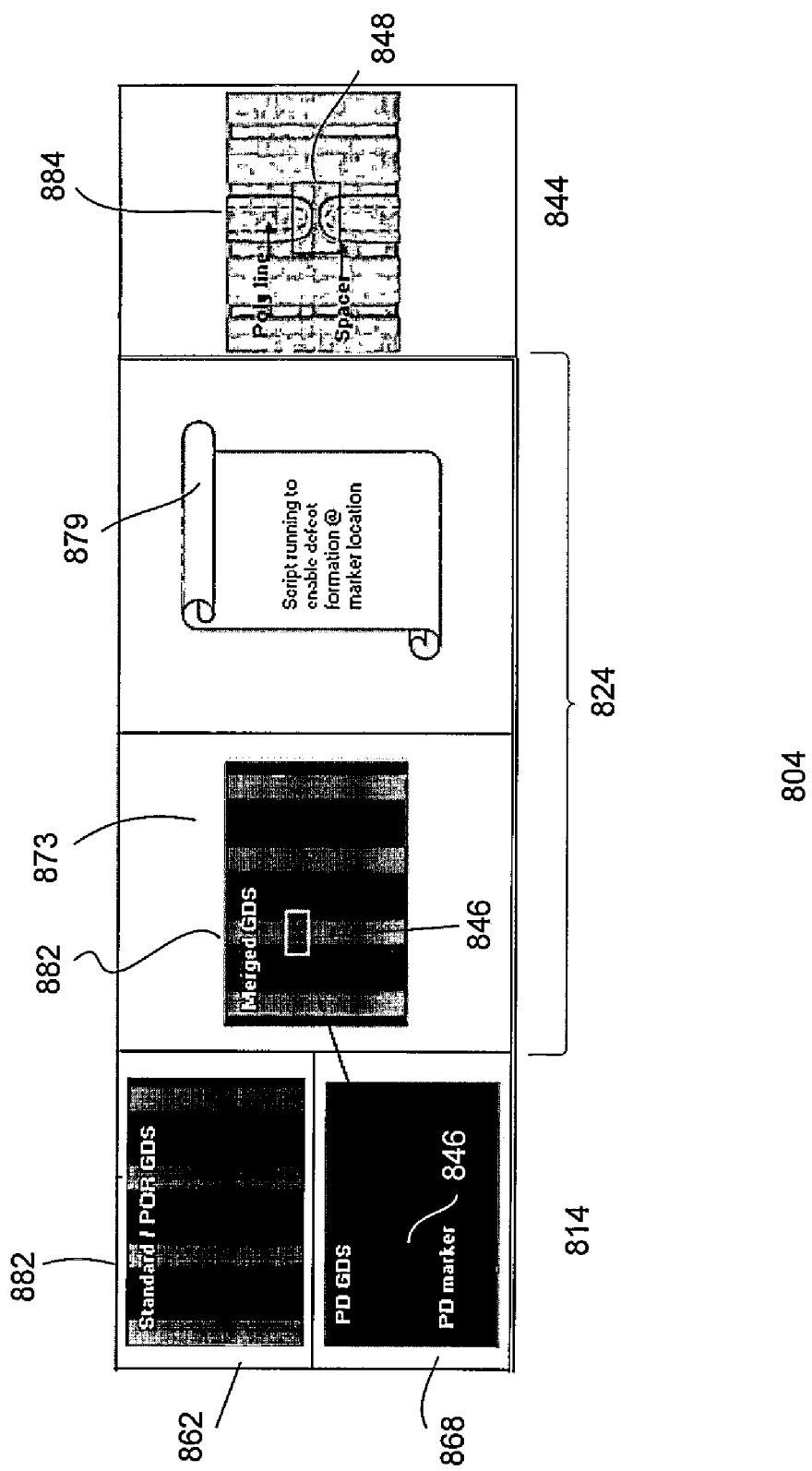

FIG. 9b shows another process 804 for incorporating a defect into a cell. The process involves merging two artwork files together using, for example, a script file. In one embodiment, first and second artwork files 862 and 868 are provided at step 814. The artwork files, for example, comprise GDS files. Other types of artwork files are also useful.

The first artwork file may comprise an array of test cells. The array of test cells includes standard cells with patterns corresponding to standard structures or features. For example, the array of cells contains process of record (POR) structures. A portion of a test cell is shown. The patterns may correspond to polysilicon structures at the polysilicon layer. For example, as shown, the test cells may comprise patterns corresponding to polysilicon line structures 882. The cell may include patterns of other types of structures, such as structures of other layers. For example, the structures may be interconnect lines of an interconnect layer, vias or contacts of a via or contact layer or active structures of an active layer.

As for the second artwork file, it contains defect information. For example, the second artwork file contains programmed defect (PD) information, such as PD markers. A PD marker indicates the location or type of deformation of the feature in the first artwork file. For example, the PD marker indicates the location of the defect in the corresponding layer of the cell and whether the defect is narrowing or widening of a feature pattern to create necking or bridging type of defect. Other types of defects may also be useful. Additional PD markers may be included in the second artwork file for programming other defects into the array of test cells. For example, additional PD markers may be included corresponding to other desired locations of other cells. The defects of the array need not be of the same type of defects. For example, different cells of the array may have different types of defects.

At step 824, the first and second artwork files are merged to create a merged artwork file 873 containing defects corresponding to location and type of the defects based on the PD markers. For example, the PD marker contains a narrowing type of defect at one of the line feature patterns. Providing a PD marker with other types of defects is also useful.

In one embodiment, merging of the artwork file is performed automatically by a script file 879. The script file, for example, is a computer program generated for execution on a computer. The script file receives as inputs the first and second artwork files and merges them together automatically.

A mask can be created based on the information contained in the merged artwork file. The mask can be employed to form a physical layer with the desired pattern on a wafer at step 844. A physical defect 848 exists in the actual line feature 884 on the wafer corresponding to the programmed defect. As can be seen, the defect is a narrowing defect which creates an open connection in the line feature.

The artwork files can be merged to create the merged artwork file at various stages of the tapeout process flow. The merged artwork file can be formed after the first artwork file is created, such as at the GDSin stage. Alternatively, the merged artwork file may be created after OPC. For example, the artwork file containing the PD markers may be merged with a GDSout or MEBES file. The format of the artwork file containing the PD markers should be compatible with or cater to the artwork file containing the test chiplet.

Figure 9C:
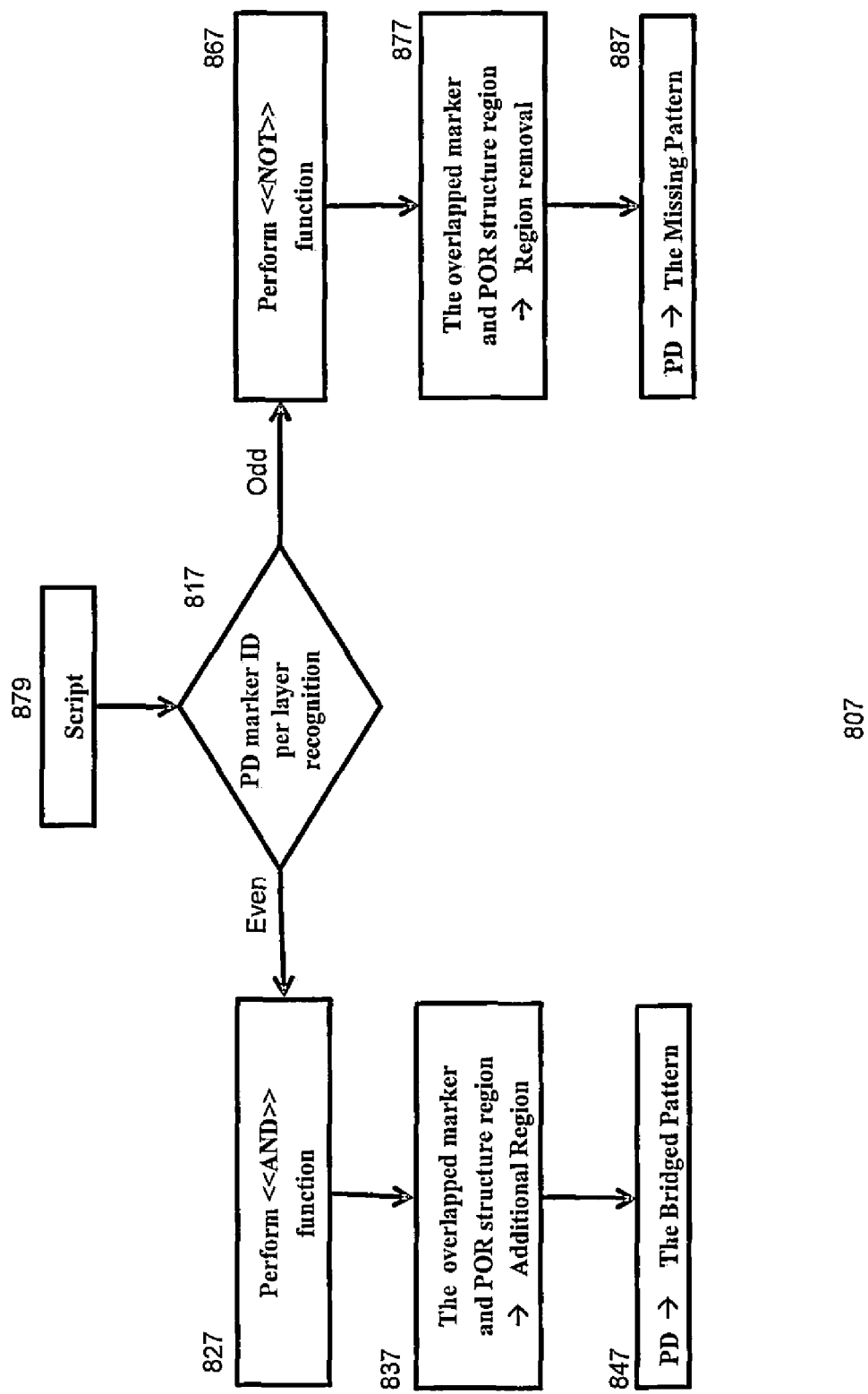
FIG. 9c shows a process flow performed by an embodiment of a script file.

FIG. 9c shows a process flow 807 performed by an embodiment of a script file 879. First and second artwork files are input into the script file. In one embodiment, the first artwork file contains POR structures of at least a test chiplet. The artwork file may contain all the layers of the test chiplet. The second artwork file contains PD markers for the test chiplet. The PD markers correspond to the location and types of defects in the different layers of the test chiplet. The artwork files, for example, comprise GDS files. For example, the first file comprises a GDSin file and the second artwork file comprises a GDS marker file. The first artwork file may also be an MEBES file.

In one embodiment, the script file programs defects into the test chiplet layer by layer. For example, the script file programs the defects into the layers in an ordered sequence, such as bottom up or top down. Programming the layers in other configurations is also useful. In one embodiment, the script file programs defects of a first layer of the device followed by other layers until all layers are programmed with defects.

A PD marker, in one embodiment, includes a layer ID and a defect type ID. For example, the PD marker may be in the format of X.Y, where X is the layer ID and Y is the defect ID. The layer ID may be a number identifying the layer of the device or chiplet. For example, the number 2 may correspond to the active layer of the device. As for Y, it may either be an even number or odd number to indicate the first or second type defect. An odd number, for example, may correspond to a necking type of defect while an even number may correspond to a bridging type of defect. The location of the PD marker in the artwork file corresponds to the location of the defect. The shape of the PD marker indicates the changes to the first artwork file.

As an example, a PD marker ID equal to 2.1 may correspond to a necking defect in the active layer of the device. The shape and location of the PD marker will correspond to the pattern and location in the first artwork file which is to be removed. In the case where the PD marker corresponds to a bridging defect, the shape and location of the PD marker will correspond to the pattern and location in the first artwork file which is to be added.

At step 817, the script file determines whether the defect type ID of a PD marker, for example, of the first layer in the second artwork file indicates a first or a second type of defect. For example, an even number indicates a first type of defect and an odd number indicates a second type of defect. In one embodiment, an even number indicates a bridging type of defect and an odd number corresponds to a necking type of defect.

The process flow proceeds to step 827 if the defect type ID is an even number. In one embodiment, an even number indicates that the type of defect is a bridging type of defect. Providing an even number which indicates another type of defect is also useful. The script file performs an AND function on the first and second artwork files to create a bridging type of defect. For example, at step 837, the information in the PD marker is incorporated into the first artwork file. In one embodiment, the pattern of the PD marker is overlaid onto the desired POR structure region. The pattern of the PD marker is added to the desired POR structure region at step 847 to create a bridged pattern.

On the other hand, the process flow proceeds to step 867 if the defect type ID is an odd number. In one embodiment, an odd number corresponds to a necking or missing type of pattern defect. Providing an odd number which indicates another type of defect is also useful. The script file performs an NOT function on the first and second artwork files to create a necking or missing/broken pattern type of defect. For example, at step 877, the information in the PD marker is incorporated into the first artwork file. In one embodiment, the pattern of the PD marker is overlaid onto the desired POR structure region. The pattern of the PD marker is subtracted from the desired POR structure region at step 887 to create a missing pattern.

In one embodiment, step 817 is repeated until all PD markers of the layer are incorporated into the first artwork file. The PD markers of the second artwork file may be processed in sequence, such as row by row or column by column. Other arrangements for incorporating all the PD markers of a layer may also be useful.

In the case where multiple layers are programmed with defects, the script file returns to step 827 to process the next layer. The script file terminates when all layers have been programmed with defects.

In other embodiments, the script file programs only one layer of the test chiplet. For example, the first artwork file can be a GDSout file containing only a layer of the test chiplet. In such case, the PD markers which correspond to the layer in the GDSout file will be incorporated. All GDSout files may be processed by the script file individually.

FIGS. 10a-f show various embodiments of programmed defect generation flows 900. An artwork file of the device is created or provided. The artwork file, for example, comprises a GDS file. Other types of artwork files are also useful.

At step 902, the process creates a test chiplet or array. Creating the test array, in one embodiment, includes analyzing the device structures of a device to understand the various structures of the device at step 910. Once the structures of the device have been ascertained, a test cell at step 915 is created to include the structures of interest. The test cell, for example, is contained in a cell artwork file. For example, the test cell is contained in a GDS file.

The test cell is validated. For example, at step 920, a design check is performed on the test cell. The design check, for example, includes checking the pattern dimensions of the cell, distance between adjacent structures as well as design patterns. Other types of design checks may also be performed. If any design rule has been violated, the test cell is revised to correct the design violations and rechecked. The process of revising and rechecking the test cell repeats until it is validated. For example, the process of revising and rechecking the test cell repeats until compliance with all design rules has been accomplished.

In one embodiment, the test cell is contained in a plurality of artwork files, such as GDS files. For example, individual layers of the test cell are contained in respective artwork files. The process steps from 920 to 930 are repeated until all the artwork files have been processed. The validated test cell is replicated to form a test array having a plurality of test cells at step 930. For applications where the test chiplet comprises different types of cells, the process from steps 915-930 are repeated until all artwork files of all the different types of cells have been processed. The different cells can then be assembled, for example, into a test array having different sub-arrays for the respective types of test cells. The different files of the test array, for example, can be referred to as test GDSin files.

The test array, in one embodiment, may be inserted into the scribe region adjacent to the device. For example, the test array may be inserted into one of the scribe regions in the x or y direction adjacent to the device. Alternatively, the test array may be inserted into, for example, an unused or non-functional region within the device. The non-functional region may be specifically placed into the device for the purpose of the test array for monitoring purposes.

In the case where additional test arrays or chiplets are to be included, step 902 may be repeated for each test array. The test arrays may be disposed in one or some of the scribe regions and/or devices. For example, the test arrays may be disposed in one of the scribe regions in the x-direction and one of the scribe regions in the y-direction of the device. The test arrays may also be disposed in non-functional regions of the device. Other arrangements of test arrays or chiplets may also be useful.

Figure 10A:
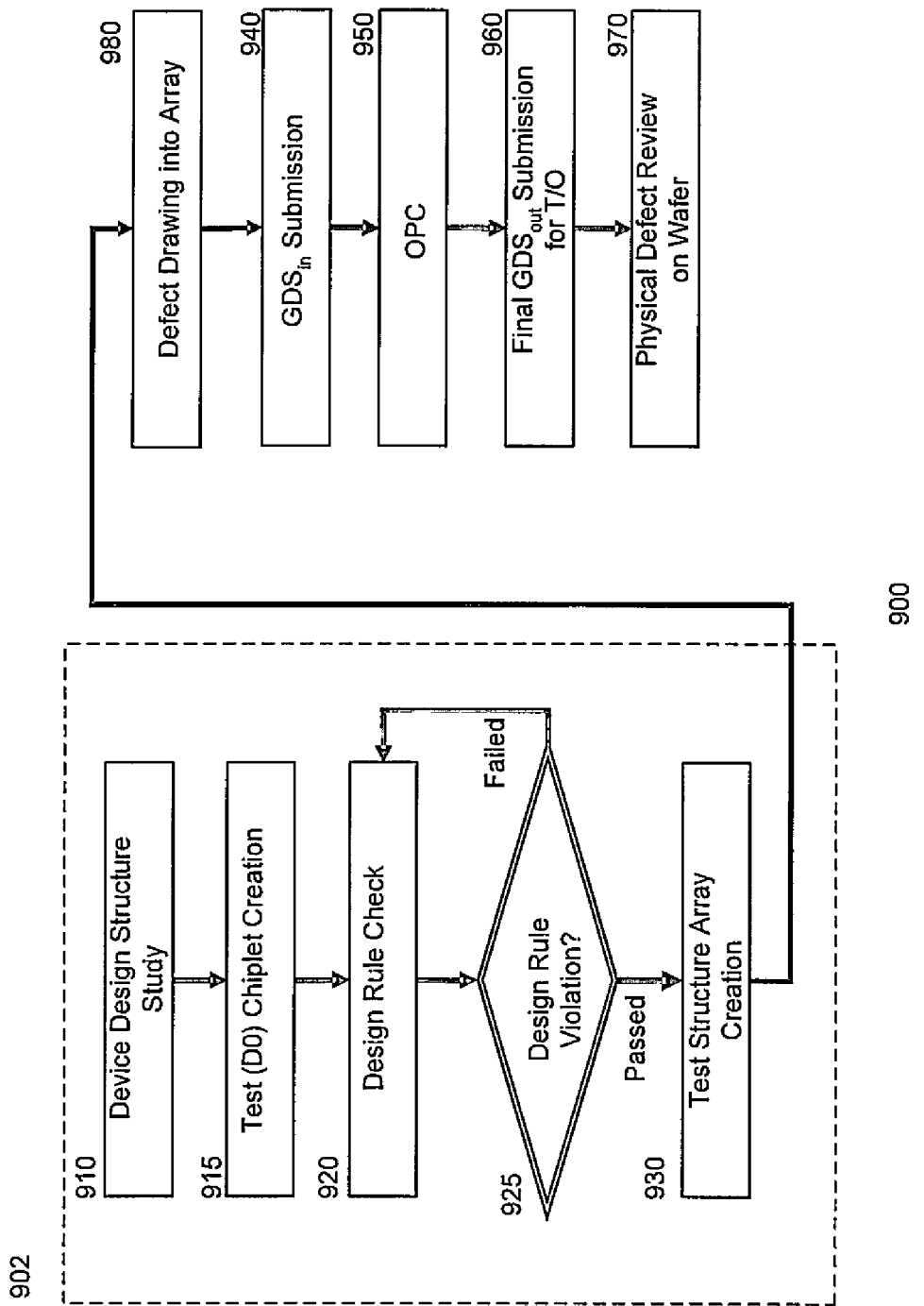
FIGS. 10a-f show embodiments of programmed defect generation flows.

In one embodiment, as shown in FIG. 10*a*, the process continues to step 980. At step 980, the artwork file (test GDSin) of the test array is programmed with defects. For example, defects are intentionally programmed into one, some or all the cells of the test array. In one embodiment, the defects are programmed into the test array by drawing the defects, as described in, for example, FIG. 9*a*. The test GDS file containing the programmed defects (modified test GDSin) is submitted for processing at step 940.

In the case where different layers of the test array are contained in individual artwork files, the process step 980 maybe repeated for the artwork files of the different layers, creating numerous modified test GDSin files for processing at step 940. Optical proximity correction (OPC) is performed on a test GDSin file at step 950. Processing of the artwork file includes, in one embodiment, OPC at step 950. After OPC, a test GDSout file is generated. For example, numerous test GDSout files are generated from processing the numerous modified test GDSin files. The test GDSout files are assembled with other GDSout files of the device for tapeout at step 960. As previously described, the tapeout file is used to create an MEBES file which is used to form a set of masks which are used to fabricate devices on a wafer. The wafer with the devices and defects are inspected for review at step 970.

Figure 10B:
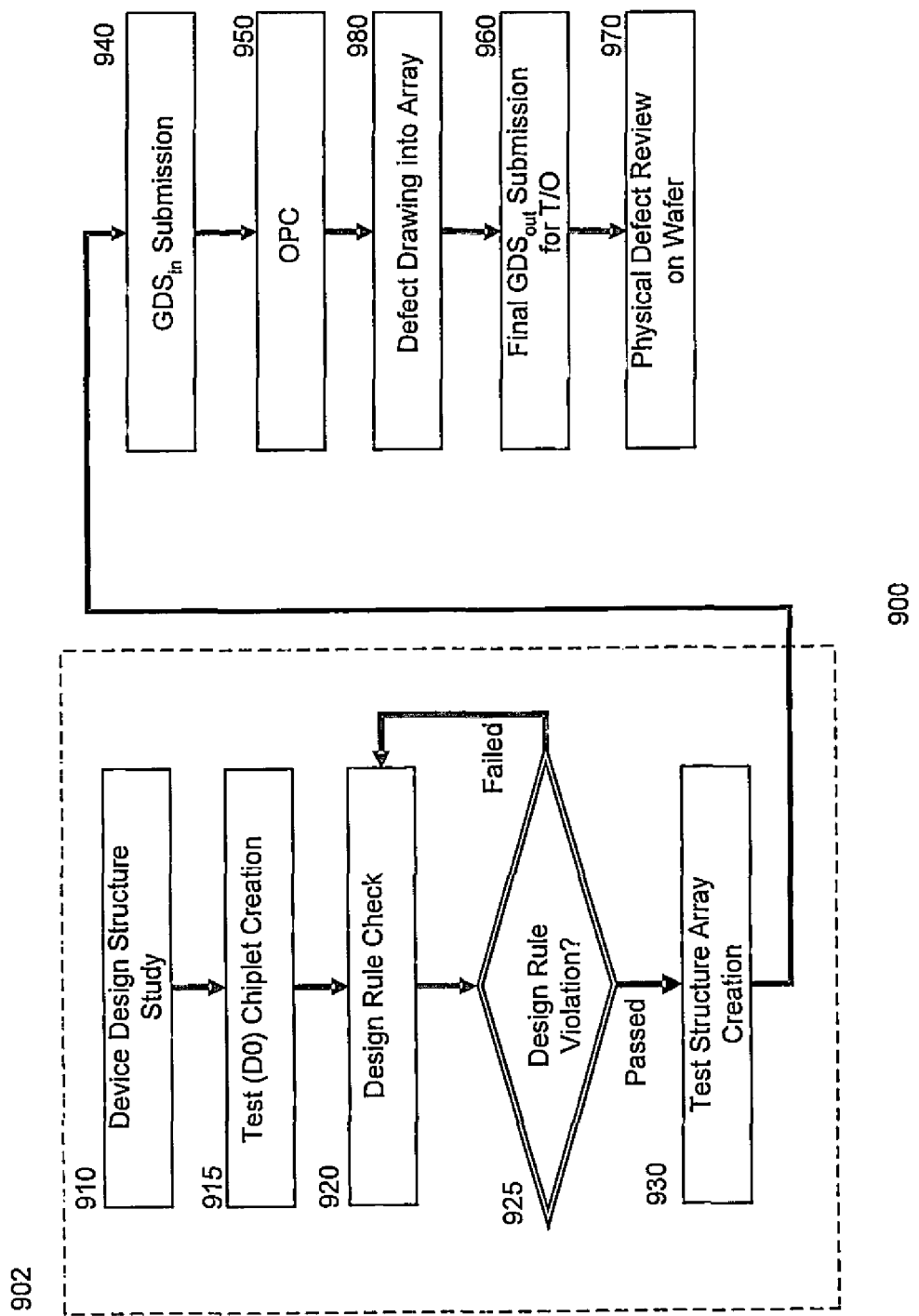

FIG. 10*b* shows another embodiment of a process flow 900 for incorporating programmed defects into the artwork files. As shown, the process flow is similar as that described in FIG. 10*a* except that the programmed defects are not programmed into the test GDSin files. Instead, the programmed defects are incorporated into a test GDSout file after OPC has been performed at step 950. In one embodiment, the defects are drawn into the GDSout files, as described in FIG. 9*a*. Step 980 is repeated, for example, for all GDSout files. The process continues by submitting all the modified test GDSout files for final tapeout with other GDSout files of the device to form an MEBES file at step 960. The masks formed from the MEBES file are used to fabricate devices on a wafer. The wafer with the devices and defects are inspected for review at step 970.

Figure 10C:
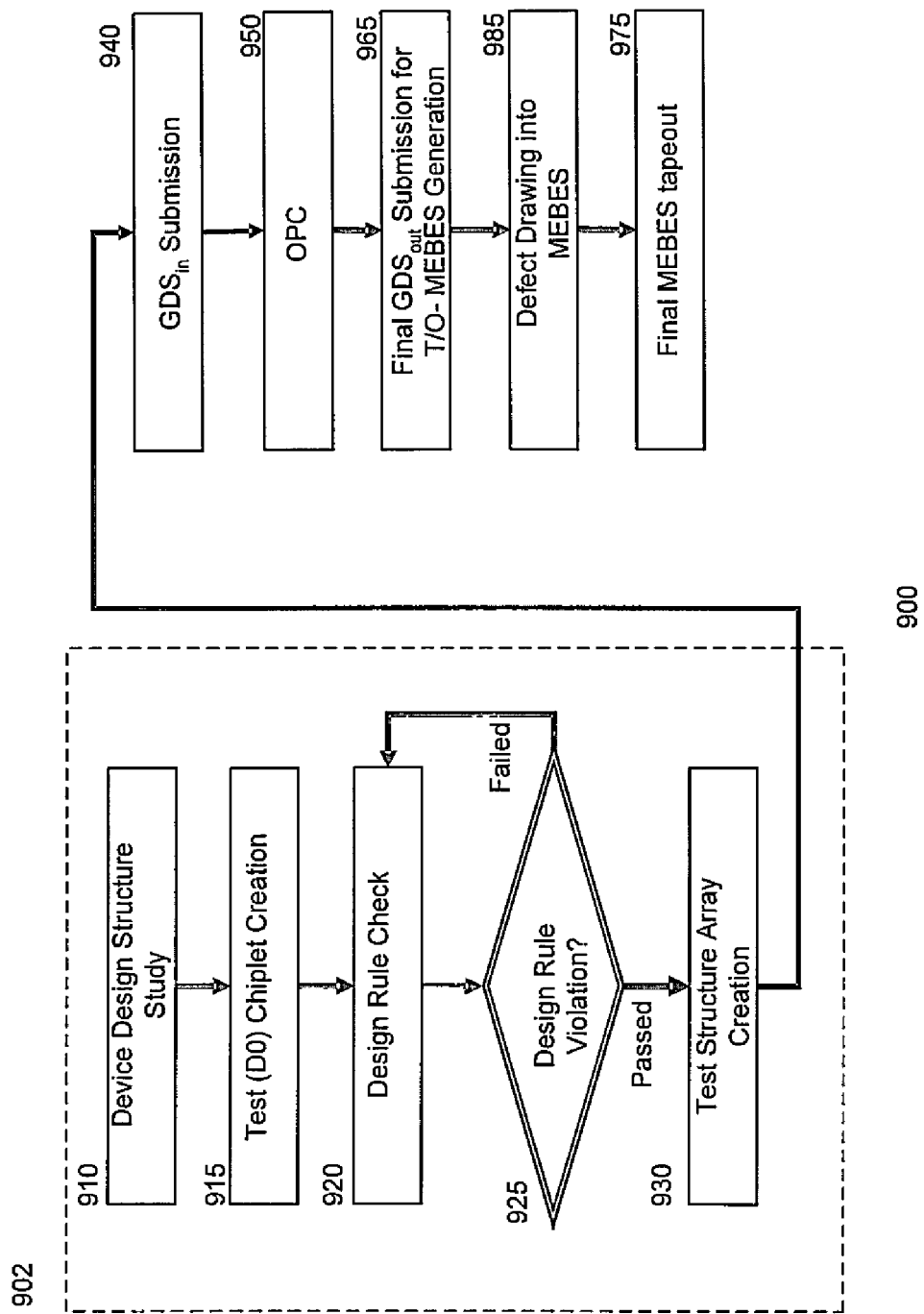

FIG. 10*c* shows another embodiment of a programmed defect generation flow 900. As shown, the process is similar to that of FIG. 10*b* except that the programmed defects are incorporated at step 985 into the MEBES file which has been generated at step 965. The programmed defects, in one embodiment, are drawn into the MEBES file. For example, the defects at the different levels are drawn into the test array portion of the device. Thereafter, the modified MEBES file is resubmitted for tapeout to form the set of masks used to form the device.

Figure 10D:
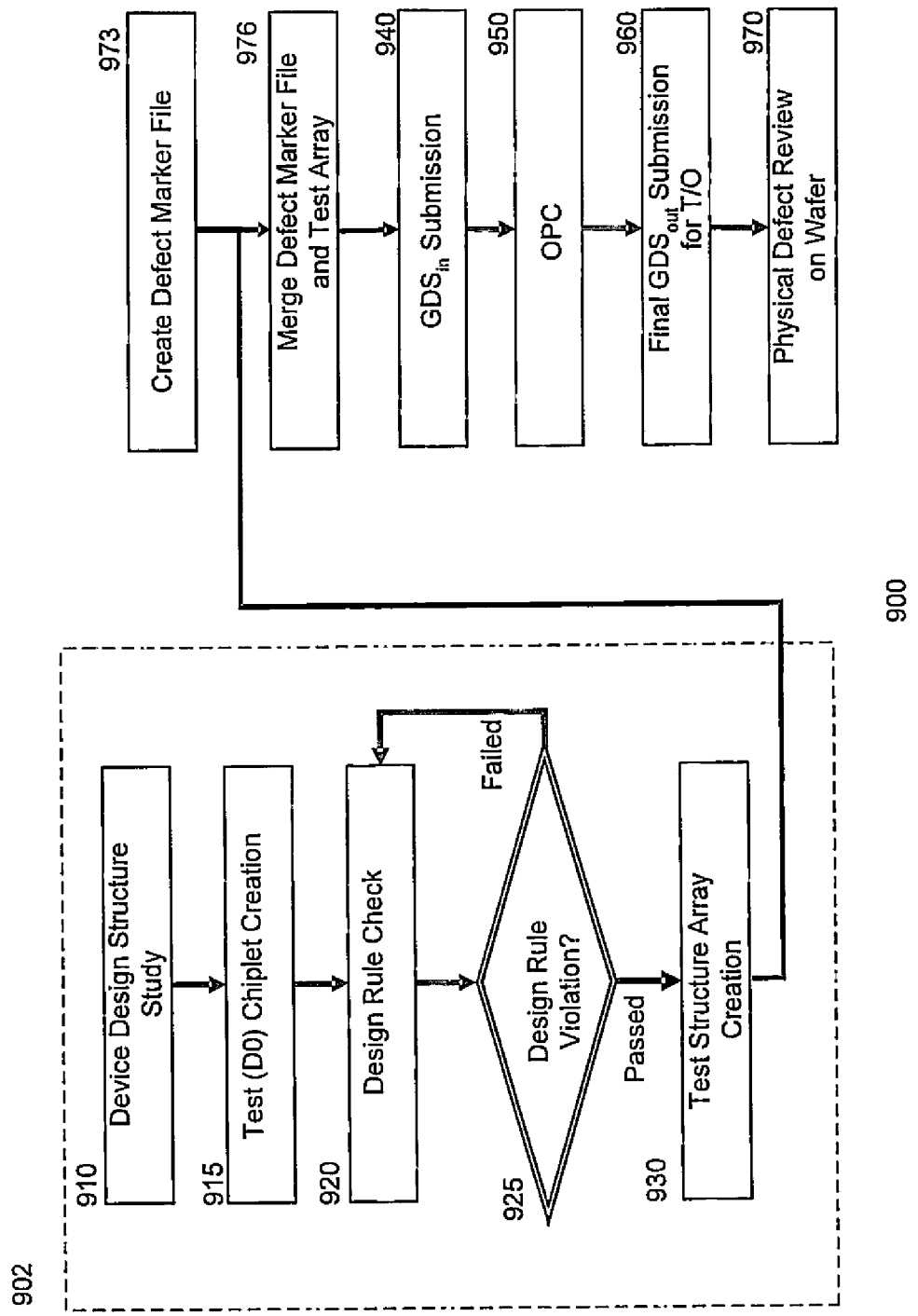

FIG. 10*d* shows yet another embodiment of a programmed defect generation flow 900. As shown, the process is similar to that of FIG. 10*a* except that the programmed defects are not incorporated into the test GDSin files created at step 930 by drawing. In one embodiment, a defect marker artwork file comprising PD markers indicating the type and location of the defects to be programmed in, for example, a corresponding layer of a GDSin file is created at step 973. The defect marker artwork file is merged with a corresponding test GDSin file at step 976 using, for example, a script file such as that described in FIGS. 9*b*-*c*. The merged test GDSin file is submitted for OPC at step 950. Steps 973-950 are repeated until all test GDSin files have been merged with corresponding defect marker files.

The process continues to final tapeout by assembling all the test GDSout files and other GDSout files of the device to form an MEBES file at step 960. The MEBES file is used to form a set of masks which are used to fabricate devices on a wafer. The wafer with the devices and defects are inspected for review at step 970.

Figure 10E:
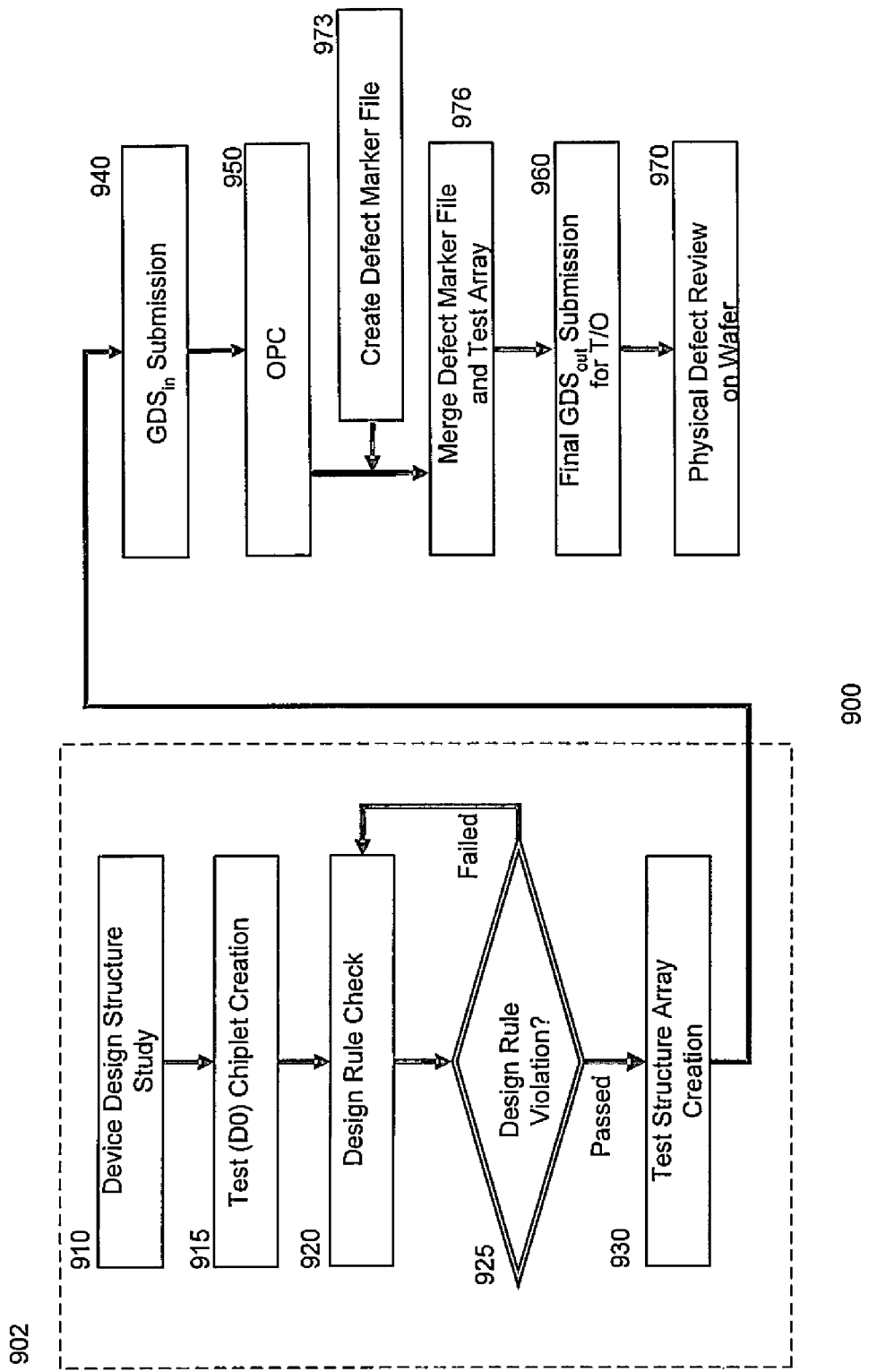

FIG. 10*e* shows yet another embodiment of a programmed defect generation flow 900. As shown, the process is similar to that of FIG. 10*d* except that the programmed defects are incorporated after OPC has been performed at step 950. In one embodiment, a defect marker artwork file comprising PD markers indicating the type and location of the defects to be programmed in, for example, a corresponding layer of a GDSout file is created at step 973. The defect marker artwork file is merged with a corresponding test GDSout file at step 976 using, for example, a script file such as that described in FIGS. 9*b*-*c*. Steps 973 and 976 are repeated until all test GDSout files have been merged with corresponding defect marker files. The merged test GDSout files are submitted for final tapeout at step 960. Tapeout includes assembling all the test GDSout files and other GDSout files of the device to form an MEBES file. The MEBES file is used to form a set of masks which are used to fabricate devices on a wafer. The wafer with the devices and defects are inspected for review at step 970.

Figure 10F:
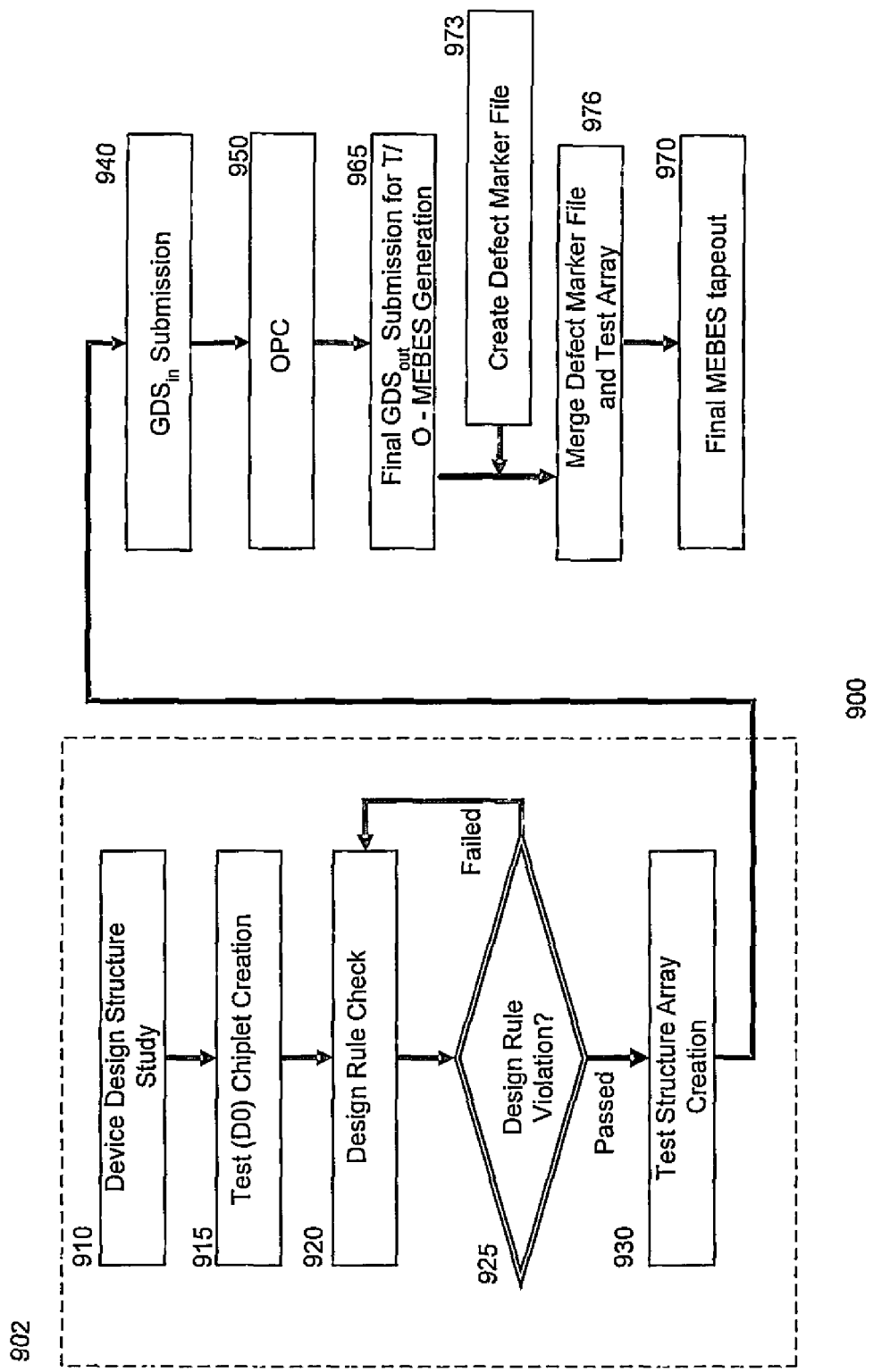

FIG. 10*f* shows another embodiment of a programmed defect generation flow 900. As shown, the process is similar to that of FIG. 10*e* except that the programmed defects are incorporated into an MEBES file formed at step 965 by assembling the test GDSout files and other GDSout files of the device.

In one embodiment, a defect marker artwork file comprising PD markers indicating the type and location of the defects to be programmed in, for example, a corresponding layer of the MEBES file is created at step 973. The defect marker artwork file is merged with a corresponding MEBES file at step 976 using, for example, a script file such as that described in FIGS. 9*b*-*c*. Steps 973 and 976 are repeated until all defect marker files corresponding to different layers have been processed. The merged MEBES file is submitted for final tapeout at step 970 to create a final MEBES file. The final MEBES file is used to form a set of masks which are used to fabricate devices on a wafer. The wafer with the devices and defects may be inspected for review.

As described, the defects are incorporated into files containing an array of test cells. In other embodiments, the defects can be incorporated into files that contain an array of test cells as well as components of a device. For example, the chiplet may include test sub-chiplets and device chiplets together. Other configurations of design flow and defect incorporation flow may also be useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the forego-

What is claimed is:

1. A method of forming a device comprising:
providing a substrate on which the device is formed;
providing a test artwork file containing a test cell;
modifying the test artwork file to program a defect into the test cell, wherein modifying the test artwork file comprises
providing a defect artwork file containing defect information, and
incorporating the defect information from the defect artwork file into the test artwork file to produce a modified test artwork file with programmed defect;
forming a mask set derived from the modified test artwork file; and
using the mask set to form the test cell on the substrate, the test cell including the defect programmed facilitates defect detection.

2. The method of claim 1 forming a test chiplet comprising a plurality of test cells, wherein the test chiplet includes programmed defects to facilitate defect detection.

3. The method of claim 2 wherein the test chiplet comprises a plurality of sub-arrays of test cells.

4. The method of claim 2 wherein the test chiplet is disposed in a scribe region of the device or within the device or a combination thereof.

5. The method of claim 4 forming a test chiplet comprising a plurality of test cells, wherein the test chiplet includes programmed defects to facilitate defect detection.

6. The method of claim 5 wherein the test chiplet comprises a plurality of sub-arrays of test cells.

7. A method of forming a test chiplet comprising:
providing a test artwork file containing the test chiplet;
modifying the test artwork file to program defects into the test chiplet, wherein modifying the artwork file comprises
providing a defect artwork file containing defect information, and
incorporating the defect information from the defect artwork file into the test artwork file to produce a modified test artwork file with the programmed defect;
forming a mask set derived from the modified test artwork file; and
using the mask set to form the test chiplet on a substrate.

8. The method of claim 7 wherein the test chiplet comprises an array of test cells.

9. The method of claim 8 wherein the test chiplet comprises a plurality of sub-arrays of test cells, wherein the test cells of a sub-array are identical except for the defects.

10. The method of claim 7 wherein modifying the artwork file is performed before optical proximity correction.

11. The method of claim 8 wherein the test artwork file comprises a test artwork file containing layers of the test chiplet.

12. The method of claim 8 wherein the test artwork file comprises a GDSin file containing layers of the test chiplet.

13. The method of claim 7 wherein modifying the test artwork file is performed after optical proximity correction.

14. The method of claim 13 wherein the test artwork file comprises a plurality of artwork sub-files, wherein a sub-file contains one layer of the test chiplet.

15. The method of claim 14 wherein the artwork sub-files comprise GDSout files.

16. The method of claim 7 wherein the test artwork file comprises an artwork file containing layers of the test chiplet.

17. The method of claim 16 wherein the test artwork file comprises an MEBES file.

18. The method of claim 7 wherein incorporating the defect information is performed by a script file.

19. A method of forming an artwork file comprising:
providing a pre-artwork file containing a test chiplet; and
modifying the pre-artwork file to program defects into the test chiplet, wherein modifying the pre-artwork file comprises
providing a defect artwork file containing defect information, and
incorporating the defect information from the defect artwork file into the pre-artwork file to produce a test artwork file with the programmed defect.

20. The method of claim 19 wherein the test chiplet comprises an array of test cells.

* * * * *